US008289236B2

(12) United States Patent
Yamamoto et al.

(10) Patent No.: US 8,289,236 B2
(45) Date of Patent: Oct. 16, 2012

(54) METHOD FOR REPLACING A MAIN SIGNAL LINE WITH A SUB SIGNAL LINE WHEN A PIXEL CIRCUIT IS DEFECTIVE

(75) Inventors: Tetsuro Yamamoto, Kanagawa (JP); Katsuhide Uchino, Kanagawa (JP); Naobumi Toyomura, Kanagawa (JP)

(73) Assignee: Sony Corporation, Tokyo (JP)

( * ) Notice: Subject to any disclaimer, the term of this patent is extended or adjusted under 35 U.S.C. 154(b) by 860 days.

(21) Appl. No.: 11/984,715

(22) Filed: Nov. 21, 2007

(65) Prior Publication Data
US 2008/0150843 A1 Jun. 26, 2008

(30) Foreign Application Priority Data
Dec. 20, 2006 (JP) .................................. 2006-342132

(51) Int. Cl.
*G09G 3/30* (2006.01)
(52) U.S. Cl. ......................................................... 345/76
(58) Field of Classification Search .................... 345/76, 345/82; 349/192
See application file for complete search history.

(56) References Cited

U.S. PATENT DOCUMENTS

| 4,820,222 | A * | 4/1989 | Holmberg et al. ............... 445/3 |
| 7,098,989 | B2 * | 8/2006 | Wu ................................ 349/192 |
| 2002/0054248 | A1 * | 5/2002 | Cheng et al. .................... 349/54 |
| 2004/0012727 | A1 * | 1/2004 | Kim et al. ........................ 349/54 |
| 2006/0038180 | A1 * | 2/2006 | Lai ................................. 257/72 |

FOREIGN PATENT DOCUMENTS

| JP | 08-234683 | | 9/1996 |
| JP | 09-090318 | A | 4/1997 |
| JP | 09-222615 | A | 8/1997 |
| JP | 10-123563 | A | 5/1998 |
| JP | 10-232412 | A | 9/1998 |
| JP | 2000-250436 | A | 9/2000 |
| JP | 2004-198718 | A | 7/2004 |
| JP | 2005-043639 | A | 2/2005 |
| JP | 2005-165048 | A | 6/2005 |
| JP | 2005-215094 | A | 8/2005 |
| JP | 2006-011162 | A | 1/2006 |

OTHER PUBLICATIONS

Japanese Office Action issued Dec. 6, 2012 for corresponding Japanese Application No. 2006-342132.
Japanese Office Action issued May 22, 2012 for corresponding Japanese Application No. 2006-342132.

* cited by examiner

*Primary Examiner* — Alexander Eisen
*Assistant Examiner* — Mark Regn
(74) *Attorney, Agent, or Firm* — Rader, Fishman & Grauer, PLLC

(57) ABSTRACT

An active-matrix-type organic EL display panel having pixel circuits includes a main signal and a sub-signal line wired vertically in parallel to each other. There are two horizontal, parallel wiring lines connecting the main signal line and the sub-signal line.

5 Claims, 28 Drawing Sheets

X SHORT-CIRCUITING PORTION
/ CUT PORTION BY REPAIR
= CONNECTION PORTION BY REPAIR

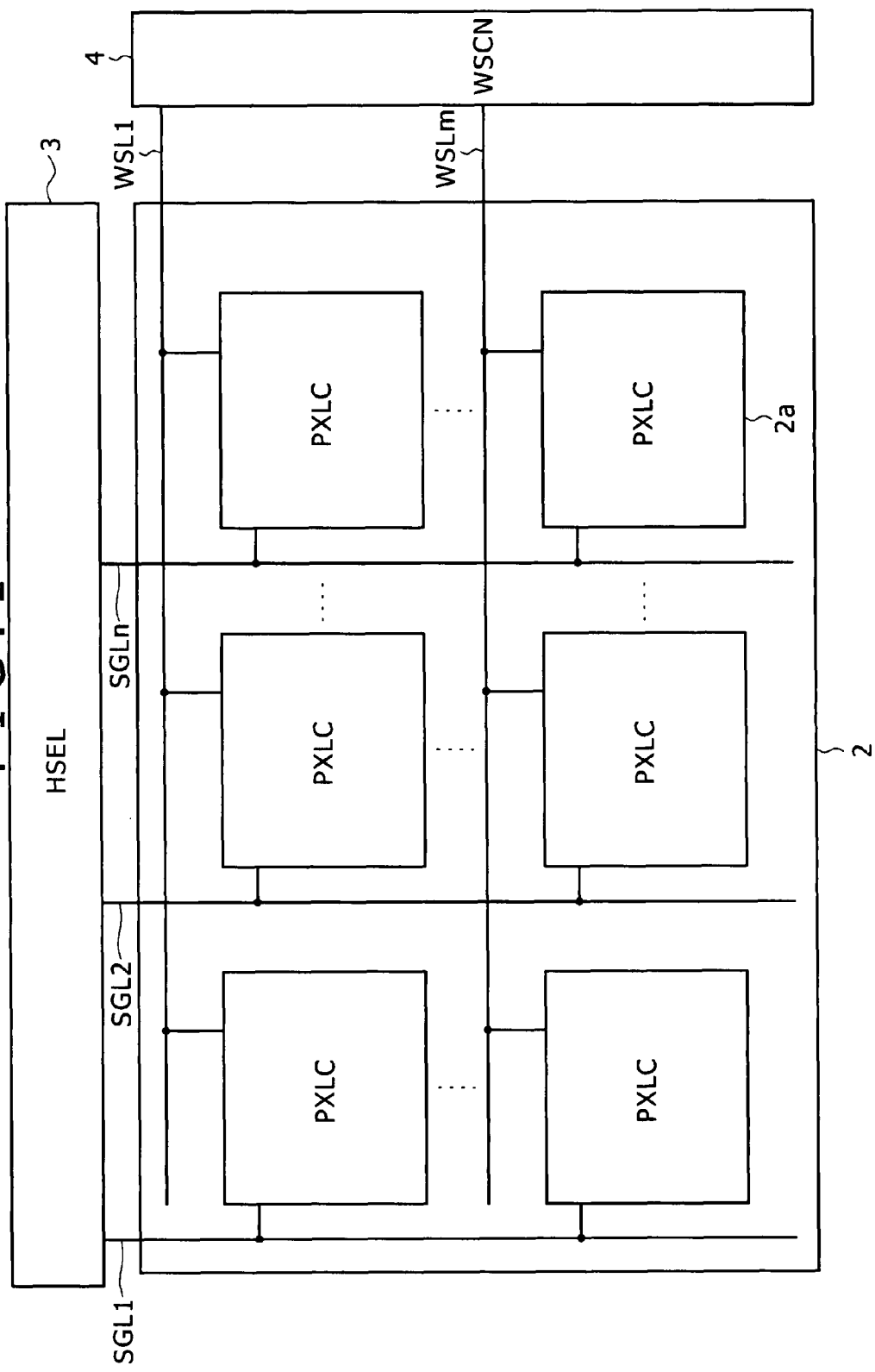

× SHORT-CIRCUITING PORTION
／ CUT PORTION BY REPAIR

× SHORT-CIRCUITING PORTION
／ CUT PORTION BY REPAIR
＝ CONNECTION PORTION BY REPAIR

F I G . 1 9
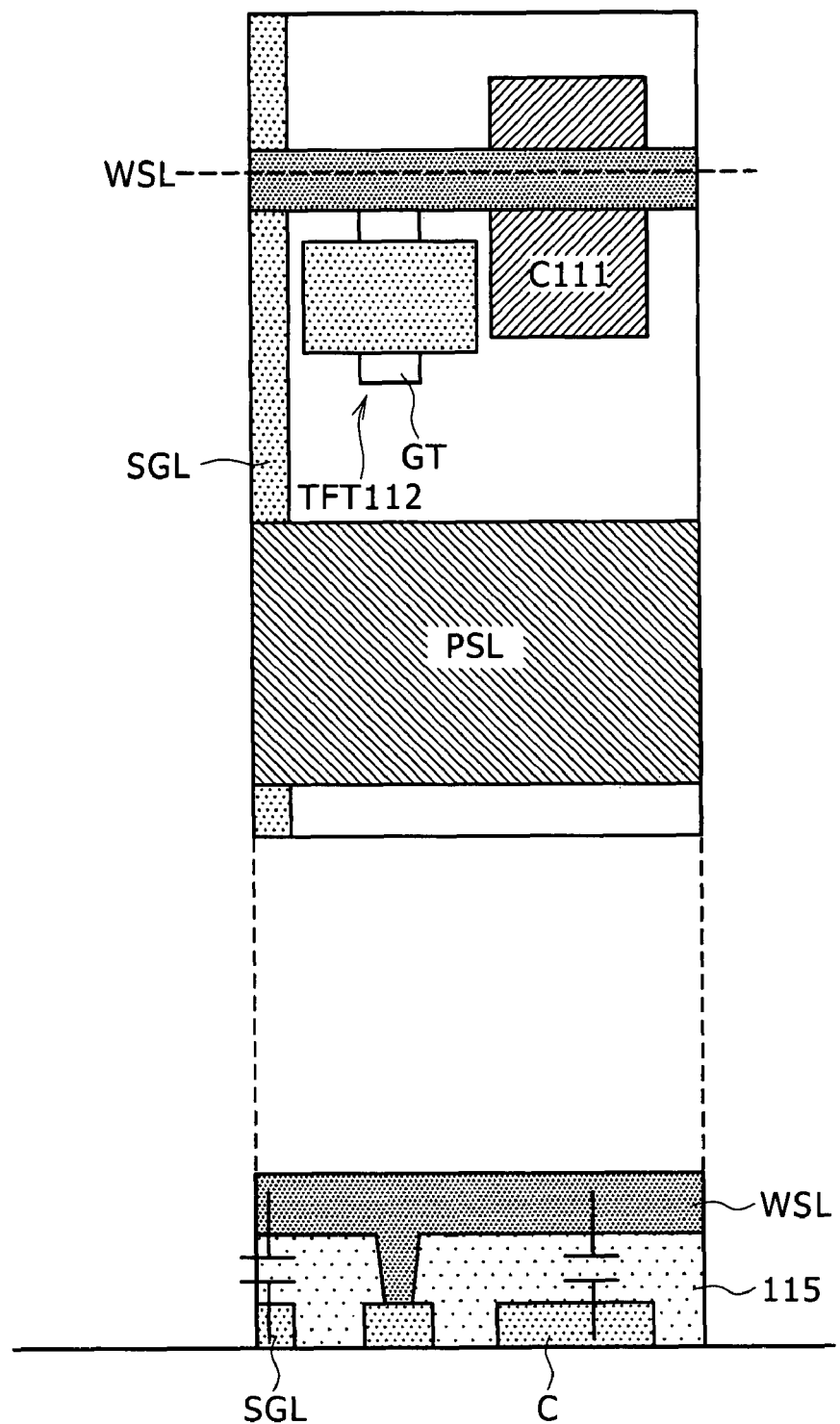

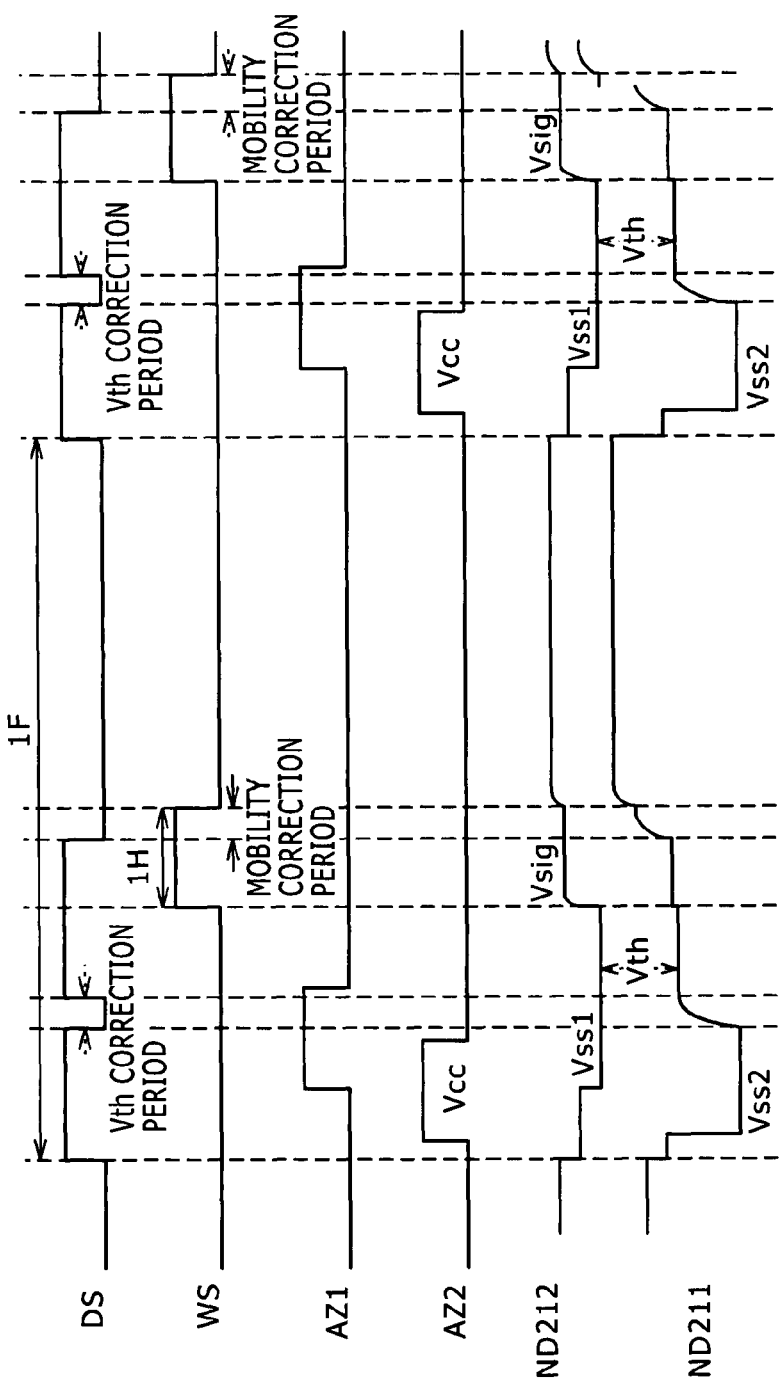

METHOD FOR REPLACING A MAIN SIGNAL LINE WITH A SUB SIGNAL LINE WHEN A PIXEL CIRCUIT IS DEFECTIVE

CROSS REFERENCES TO RELATED APPLICATIONS

The present invention contains subject matter related to Japanese Patent Application JP 2006-342132 filed in the Japan Patent Office on Dec. 20, 2006, the entire contents of which are incorporated herein by reference.

BACKGROUND OF THE INVENTION

1. Field of the Invention

The present invention relates to an active-matrix-type display apparatus wherein pixel circuits each including light-emitting elements, such as organic EL (Electroluminescence) elements, are arranged in a matrix and a fabrication method for the display apparatus.

2. Description of the Related Art

In an image display apparatus, such as a liquid crystal display unit, a great number of pixels are arrayed in a matrix, and in order to display an image, the light intensity is controlled for each of the pixels in response to the information of an image to be displayed.

While this similarly applies to an organic EL display unit or a like display unit, an organic EL display unit is a self-luminous type display unit which has a light emitting element for each of the pixel circuits. The organic EL display unit is advantageous in that, in comparison with a liquid crystal display unit, the visibility of an image is high and a backlight need not be provided, and the speed of response is high.

Further, the organic EL display unit is much different from the liquid crystal display unit in that the gradation of color development is obtained by controlling the luminance of each light-emitting element through the current value applied to the light-emitting element. In short, the light-emitting element is of the current controlled type.

While, in an organic EL display unit, a simple matrix system and an active matrix system can be applied as a driving system therefor, similarly to a liquid crystal display unit, the former system has a problem in that, while the structure is simple, it is difficult to implement a large display unit having high definition. Therefore, development of the active matrix system is carried out energetically, wherein current applied to a light-emitting element in the inside of each pixel circuit is controlled by an active element, usually by a TFT (Thin Film Transistor), provided in the pixel circuit.

FIG. 1 shows a configuration of a general organic EL display apparatus.

Referring to FIG. 1, the display apparatus 1 shown includes a pixel array section 2 wherein pixel circuits (PXLC) 2a are arranged in a m×n matrix, a horizontal selector (HSEL) 3, and a writing scanner (WSCN) 4. The display apparatus further includes signal lines or data lines SGL1 to SGLn selected by the horizontal selector 3 such that a data signal corresponding to luminance information is supplied thereto and scanning lines WSL1 to WSLm selectively driven by the writing scanner 4.

It is to be noted that the horizontal selector 3 and the writing scanner 4 may be formed from a MOSIC or the like on polycrystalline silicon or around the pixels MOSIC.

FIG. 2 shows an example of a configuration of a pixel circuit 2a shown in FIG. 1. It is to be noted that the configuration is disclosed, for example, in U.S. Pat. No. 5,684,365 or Japanese Patent Laid-Open No. Hei 8-234683.

Referring to FIG. 2, the pixel circuit shown has the simplest circuit configuration from among a great number of proposed circuit configurations and is a two-transistor driving type circuit.

The pixel circuit 2a includes a p-channel, thin-film field-effect transistor (hereinafter referred to as TFT) 11 and another TFT 12, a capacitor C11, and an organic EL light emitting element (OLED) 13 which serves as a light-emitting element. Further, in FIG. 2, reference characters SGL and WSL denote a signal line and a scanning line, respectively.

Since an organic EL light-emitting element in most cases has a rectification characteristic, it is sometimes called an OLED (Organic Light Emitting Diode). While a symbol of a diode is used to indicate a light-emitting element in FIG. 2 and so forth, the rectification characteristic is not necessarily required for the OLED in the following description.

The TFT 11 is connected at the source thereof to a power supply potential Vcc, and the light-emitting element 13 is connected at the cathode thereof to the ground potential GND. Operation of the pixel circuit 2a shown in FIG. 2 is described below.

Step ST1:

The scanning line WSL is placed into a selected state (here, into a low-level state), and a writing potential Vdata is applied to the signal line SGL. Consequently, the TFT 12 is rendered conducting to allow the capacitor C11 to be charged or discharged, and the gate potential of the TFT 11 is changed to the potential Vdata.

Step ST2:

The scanning line WSL is placed into a non-selected state (here, into a high-level state). Consequently, the signal line SGL and the TFT 11 are electrically isolated from each other. However, the gate potential of the TFT 11 is retained in stability by the capacitor C11.

Step ST3:

The current to be supplied to the TFT 11 and the light-emitting element 13 is changed to current which has a value corresponding to a gate-source voltage Vgs of the TFT 11, and the light-emitting element 13 continues to emit light with a luminance corresponding to the current value.

The operation for selecting the scanning line WSL to transmit the luminance information applied to a data line to the inside of a pixel, as at the step ST1, is hereinafter referred to as "writing."

As described above, in the pixel circuit 2a shown in FIG. 2, once writing of the potential Vdata is performed, then the light-emitting element 13 continues to emit light with a fixed luminance until the next rewriting of a potential is performed.

As described above, in the pixel circuit 2a of FIG. 2, the gate application voltage of the TFT 11, which is a driving transistor, is changed to control the value of the current to be supplied to the EL light-emitting element 13.

At this time, the p-channel driving transistor is connected at the source thereof to the power supply potential Vcc, and the TFT 11 always operates in a saturation region. Therefore, the source of the driving transistor serves as a constant current source having a current value calculated in accordance with the following expression 1:

$$Ids = \frac{1}{2} \cdot \mu(W/L)Cox(Vgs - |Vth|)^2 \quad (1)$$

where $\mu$, Cox, W, L, Vgs and Vth indicate the mobility of a carrier, the gate capacitance per unit area, the gate width, the gate length, the gate-source voltage of the TFT 11 and the threshold value of the TFT 11, respectively.

In the simple-matrix-type image display apparatus, each of light-emitting elements emits light only at a selected moment, but in the active-matrix-type image display apparatus, each light-emitting element continues to emit light also after the writing comes to an end, as described hereinabove. Therefore, the active-matrix-type image display apparatus is advantageous, particularly for a large display unit having a high definition, in that the peak luminance and the peak current of the light-emitting elements can be decreased in comparison with the simple-matrix-type image display apparatus.

FIG. 3 illustrates the aged deterioration of a current-voltage (I-V) characteristic of an organic EL light-emitting element. Referring to FIG. 3, a curved line indicated by a solid line indicates a characteristic in an initial state, and a curved line indicated by a broken line indicates a characteristic after aged deterioration.

Generally, as times passes, the I-V characteristic of an organic EL light-emitting element deteriorates as seen in FIG. 3.

However, in the two-transistor driving in FIG. 2, constant current is continuously supplied to the organic EL light emitting element in order to perform the constant current driving as described above. Therefore, even if the I-V characteristic of the organic EL light-emitting element deteriorates, the light emission luminance of the EL device does not deteriorate with time.

Incidentally, while the pixel circuit 2a of FIG. 2 is formed from the p-channel TFTs, if the pixel circuit 2a can be formed from n-channel TFTs, then an existing amorphous silicon (a-Si) process can be used for TFT production. Consequently, a reduction of the cost of a TFT substrate can be anticipated.

Now, a basic pixel circuit where each transistor is replaced with a n-channel TFT is described.

FIG. 4 shows a pixel circuit wherein the p-channel TFTs in the circuit shown in FIG. 2 are replaced with n-channel transistors.

The pixel circuit 2b shown in FIG. 4 includes a n-channel TFT 21 and another n-channel TFT 22, a capacitor C21, and an organic EL light-emitting element (OLED) 23 serving as a light-emitting element. Further, in FIG. 4, reference characters SGL and WSL denote a data line and a scanning line, respectively.

In the pixel circuit 2b, the TFT 21 serving as a driving transistor is connected at the drain side thereof to the power supply potential Vcc and at the source thereof to the anode of the EL light-emitting element 23 in such a manner as to form a source follower circuit.

FIG. 5 illustrates an operation point of the TFT 21 as the driving transistor and the EL light-emitting element 23 in an initial state. In FIG. 5, the axis of abscissa indicates the drain-source voltage Vds of the TFT 21, and the axis of ordinate indicates the drain-source current Ids of the TFT 21.

As seen in FIG. 5, the source voltage depends upon an operation point between the TFT 21 serving as the driving transistor and the EL light-emitting element 23, and has a value which differs depending upon the gate voltage.

Since the TFT 21 is driven in a saturation region, the current Ids is supplied which has a current value calculated in accordance with the equation represented by the expression 1 regarding the voltage Vgs corresponding to the source voltage at the operation point.

SUMMARY OF THE INVENTION

The pixel circuit described above is the simplest circuit including the TFT 21 as the driving transistor, the TFT 22 as the switching transistor and the OLED 23. However, a configuration may be applied wherein the power signal to be applied to a power supply line is changed over between two signals and also the video signal to be supplied to a signal line is changed over between two signals so as to correct the threshold value and the mobility.

Or, a different configuration may be applied, wherein TFTs for cancellation of the mobility and the threshold value, as well as a driving transistor and a switching transistor connected in series to an OLED, are provided.

In an active-matrix-type organic EL display panel which includes pixel circuits arranged in a matrix and including a TFT as a switching transistor or a TFT for the threshold value or for the mobility which is provided separately, a gate pulse is applied to the gate of a desired one of the TFTs through a wiring line. The gate pulse is produced by a vertical scanner, such as a writing scanner, disposed on one or both sides of the active-matrix-type organic EL display panel.

Where a pixel circuit includes two or more TFTs to each of which the pulse signal is to be applied, the timings for applying the pulse signals are significant.

However, as an increase in size and definition of a panel advances, defects such as short-circuiting between wiring lines and short-circuiting between layers apparently increase.

Particularly, if short-circuiting of signal lines or gate lines occur between layers or in the same layer, then this gives rise to the appearance of a line defect and causes a low yield.

This problem has an increasing influence as an increase in size and definition of a panel advances.

Therefore, it is demanded to provide a display apparatus which can achieve an improvement of the yield of a panel and a fabrication method for the display apparatus.

According to an embodiment of the present invention, there is provided a display apparatus including a plurality of pixel circuits arrayed in a matrix, a driving wiring line to which the pixel circuits are connected, and a plurality of signal lines wired so as to cross with the driving wiring line and having the pixel circuits connected thereto, the signal lines being wired in parallel to each other.

Preferably, the signal lines include a main signal line and a sub-signal line wired in parallel to each other, and the main signal line and the sub-signal line are connected to each other at two predetermined first and second positions across each of the pixel circuits in a wiring direction of the signal lines individually by connection wiring lines.

Preferably, where one of the pixel circuits which is to be connected is defective, the main signal line is cut at a predetermined portion thereof between a first position and the defect position and at another predetermined portion thereof between a second position and the defect position, whereby the main signal line between the first and second positions is replaced with the sub-signal line.

Preferably, the signal lines include a main signal line and a sub-signal line wired in parallel to each other, and where one of the pixel circuits which is to be connected is defective, the main signal line is cut at a predetermined portion thereof between, from between two predetermined first and second positions across the defective pixel circuit in a wiring direction of the signal lines, the first position and the defect position and at another predetermined portion thereof between the second position and the defect position, and the main signal line and the sub-signal line are connected to each other at the first position by a connection wiring line and also at the second position by another connection wiring line while the sub-signal line is cut on the outside of a processing region with respect to the first position and also on the outside of the processing region with respect to the second position, whereby the main signal line between the first and second positions is replaced with the sub-signal line.

Preferably, the signal lines include a main signal line and a sub-signal line wired in parallel to each other and the sub-signal line is wired for each of the pixel circuits, and where one of the pixel circuits which is to be connected is defective, the main signal line is cut at a predetermined portion thereof between, from between two predetermined first and second positions across the defective pixel circuit in a wiring direction of the signal lines, the first position and the defect position, and at another predetermined portion thereof between the second position and the defect position and the main signal line and the sub-signal line are connected to each other at the first position by a connection wiring line and also at the second position by another connection wiring line, whereby the main signal line between the first and second positions is replaced with the sub-signal line.

According to a second embodiment of the present invention, there is provided a fabrication method for a display apparatus which includes a plurality of pixel circuits arrayed in a matrix, a driving wiring line to which the pixel circuits are connected, and a plurality of signal lines wired so as to cross with the driving wiring line and having the pixel circuits connected thereto, the signal lines being wired in parallel to each other, including the steps of wiring the signal lines which include a main signal line and a sub-signal line which extend in parallel to each other, connecting the main signal line and the sub-signal line to each other at two predetermined first and second positions across each of the pixel circuits in a wiring direction of the signal lines individually by connection wiring lines, cutting, where one of the pixel circuits which is to be connected is defective, the main signal line at a predetermined portion thereof between the first position and the defect position, and cutting the main signal line at another predetermined portion thereof between the second position and the defect position, whereby the main signal line between the first and second positions is replaced with the sub-signal line.

According to a further embodiment of the present invention, there is provided a fabrication method for a display apparatus which includes a plurality of pixel circuits arrayed in a matrix, a driving wiring line to which the pixel circuits are connected, and a plurality of signal lines wired so as to cross with the driving wiring line and having the pixel circuits connected thereto, the signal lines being wired in parallel to each other, including the steps of wiring the signal lines which include a main signal line and a sub-signal line which extend in parallel to each other, cutting, where one of the pixel circuits which is to be connected is defective, the main signal line at a predetermined portion thereof between, from between two predetermined first and second positions across the defective pixel circuit in a wiring direction of the signal lines, the first position and the defect position, cutting the main signal line at another predetermined portion thereof between the second position and the defect position, connecting the main signal line and the sub-signal line to each other at the first position by a connection wiring line, connecting the main signal line and the sub-signal line to each other at the second position by another connection wiring line, cutting the sub-signal line on the outside of a processing region with respect to the first position, and cutting the sub-signal line on the outside of the processing region with respect to the second position, whereby the main signal line between the first and second positions is replaced with the sub-signal line.

According to a still further embodiment of the present invention, there is provided a fabrication method for a display apparatus which includes a plurality of pixel circuits arrayed in a matrix, a driving wiring line to which the pixel circuits are connected, and a plurality of signal lines wired so as to cross with the driving wiring line and having the pixel circuits connected thereto, the signal lines being wired in parallel to each other, including the steps of wiring the signal lines which include a main signal line and a sub-signal line which extend in parallel to each other, the sub-signal line being wired for each of the pixel circuits, cutting, where one of the pixel circuits which is to be connected is defective, the main signal line at a predetermined portion thereof between, from between two predetermined first and second positions across the defective pixel circuit in a wiring direction of the signal lines, the first position and the defect position, cutting the main signal line at another predetermined portion thereof between the second position and the defect position, connecting the main signal line and the sub-signal line to each other at the first position by a connection wiring line, and connecting the main signal line and the sub-signal line to each other at the second position by another connection wiring line, whereby the main signal line between the first and second positions is replaced with the sub-signal line.

With the display apparatus and the fabrication methods therefor, an improvement of the yield of a panel can be anticipated.

The above and other objects, features and advantages of the present invention will become apparent from the following description and the appended claims taken in conjunction with the accompanying drawings in which like parts or elements are denoted by like reference symbols.

BRIEF DESCRIPTION OF THE DRAWINGS

FIG. 1 is a block diagram showing a configuration of a general organic EL display apparatus;

FIG. 19 is a schematic plan view and sectional view showing a configuration wherein a capacitor is disposed at a position overlapping with a scanning line or gate line in a layering direction of layers for comparison with the configuration shown FIG. 18;

FIGS. 32A to 32F are timing charts illustrating a basic operation of the pixel circuit shown in FIG. 31.

DETAILED DESCRIPTION OF THE PREFERRED EMBODIMENTS

Figure 2:
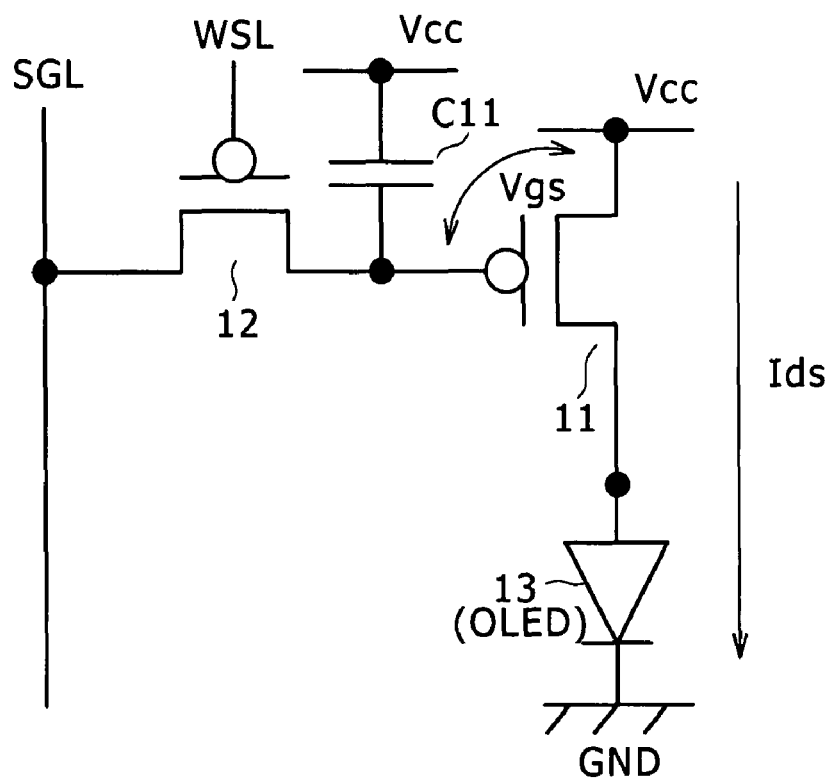
FIG. 2 is a circuit diagram showing an example of a configuration of a pixel circuit shown in FIG. 1.
Figure 3:
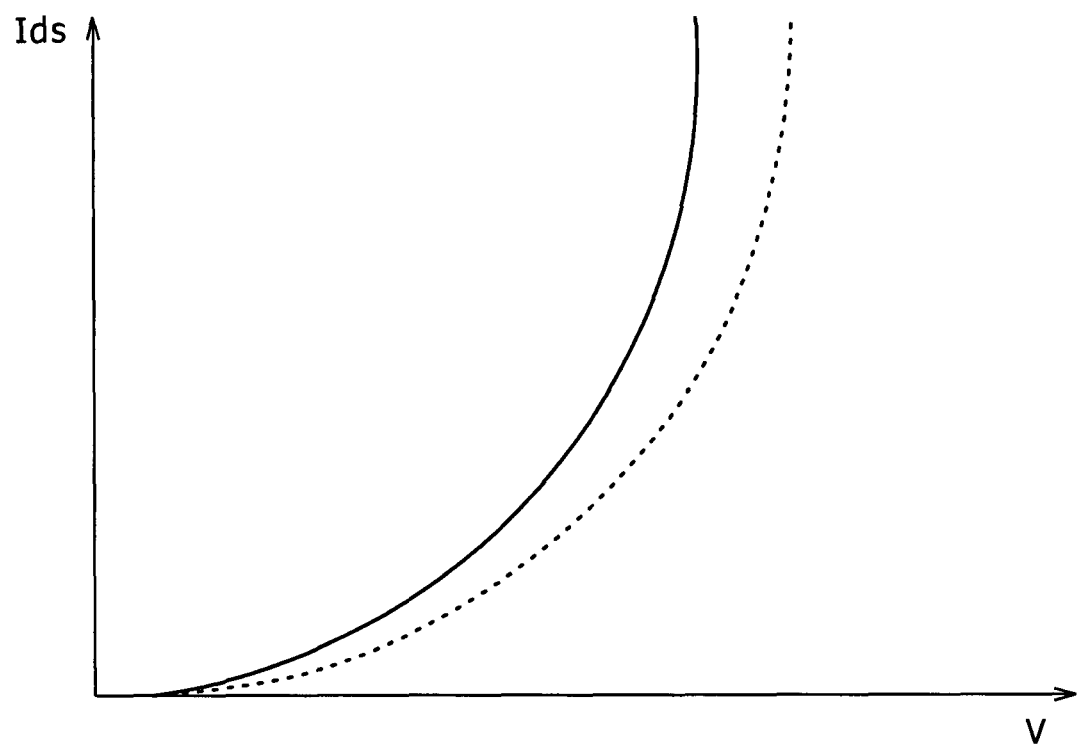
FIG. 3 is a diagram illustrating aged deterioration of a current-voltage (I-V) characteristic of an organic EL light-emitting element.
Figure 4:
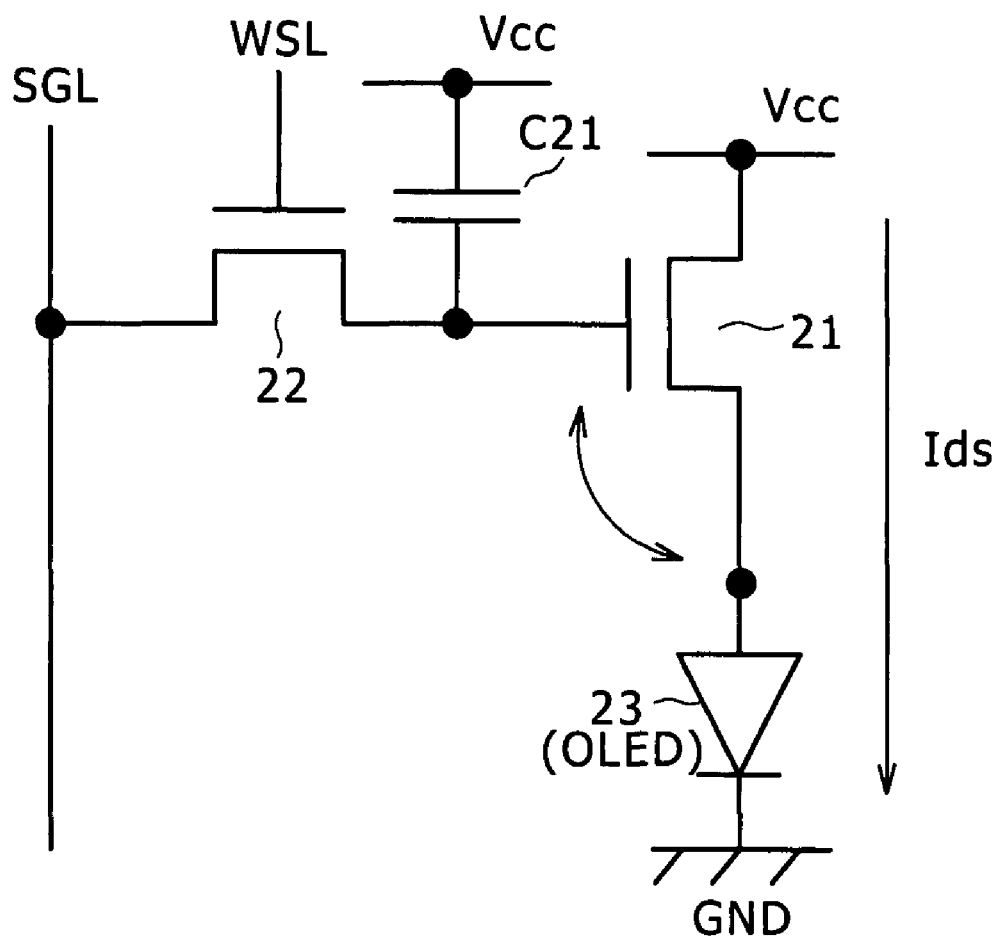
FIG. 4 is a circuit diagram showing a pixel circuit wherein p-channel TFTs in the circuit shown in FIG. 2 are replaced with n-channel TFTs.
Figure 5:
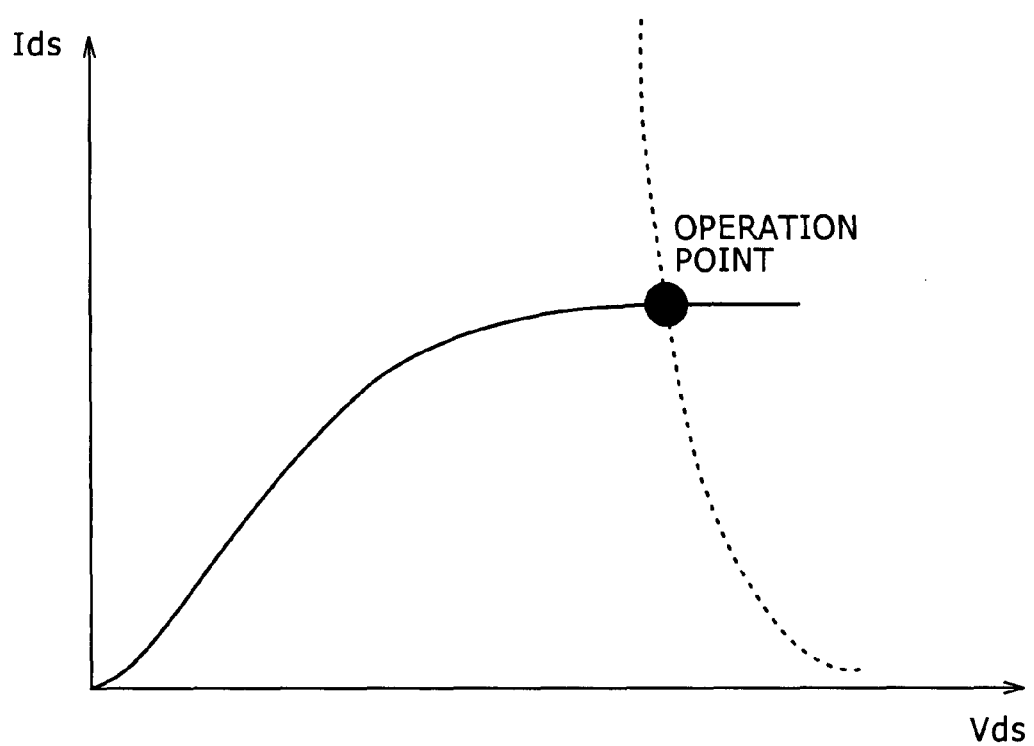
FIG. 5 is a diagram illustrating an operation point between a TFT serving as a driving transistor and an EL light-emitting element in an initial state.
Figure 6:
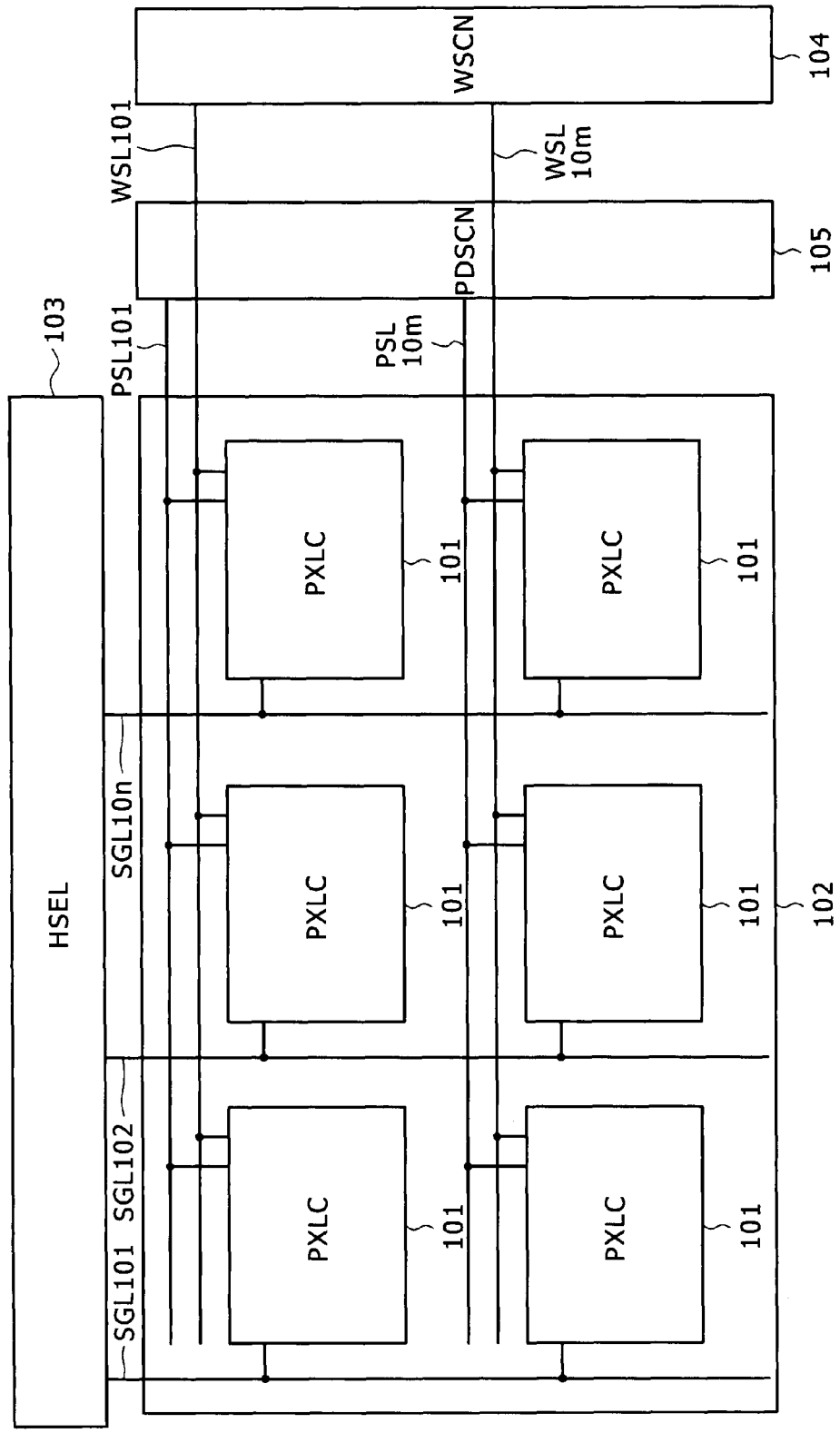
FIG. 6 is a block diagram showing a configuration of an organic EL display apparatus to which a pixel circuit according to a first embodiment of the present invention is applied.
Figure 7:
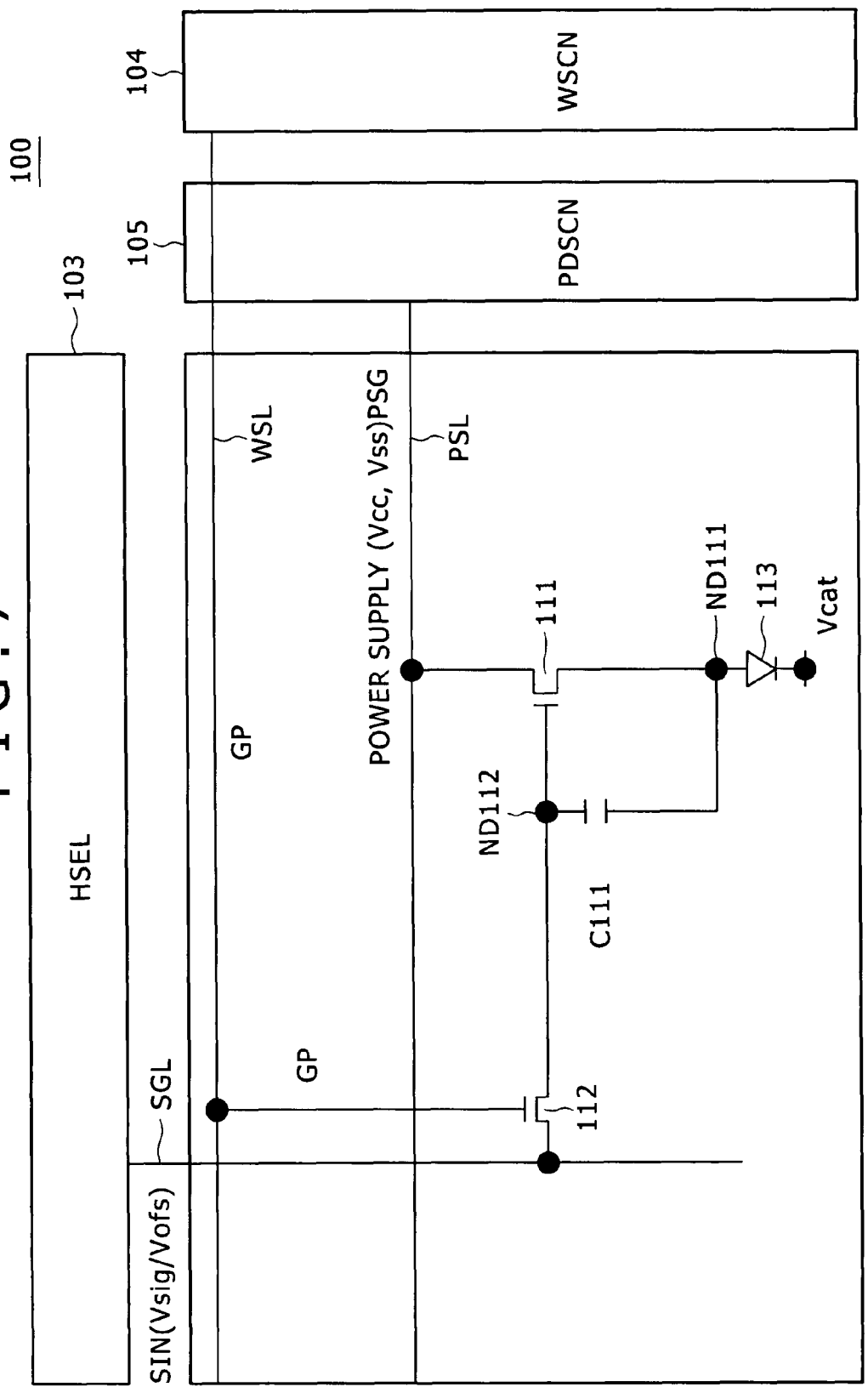
FIG. 7 is a circuit diagram showing a particular configuration of a pixel circuit shown in FIG. 6.

Referring to FIGS. 6 and 7, there is shown a configuration of an organic EL display apparatus which uses a pixel circuit according to a first embodiment of the present invention. The display apparatus 100 shown includes a pixel array section 102 including pixel circuits 101 arranged in a m×n matrix therein, a horizontal selector (HSEL) 103, a writing scanner (WSCN) 104, and a power driving scanner (PDSCN) 105. The display apparatus 100 further includes signal lines SGL101 to SGL10n to which an input signal SIN, such as a data signal Vsig and an offset signal Vofs, according to luminance information selected by the horizontal selector 103 is supplied. The display apparatus 100 further includes scanning lines WSL101 to WSL10m as driving wiring lines selectively driven by a gate pulse (scanning pulse) GP from the writing scanner 104. The display apparatus 100 further includes power driving lines PSL101 to PSL10m as driving wiring lines receiving and being driven by a power signal PSG that is set to a voltage Vcc (for example, a power supply voltage) or another voltage Vss (for example, a negative side voltage) by the power driving scanner 105.

It is to be noted that, while the pixel circuits 101 are arranged in a m×n matrix in the pixel array section 102, in order to simplify the illustration, an example wherein the pixel circuits are arranged in a 2 (=m)×3 (=n) matrix is shown in FIG. 6.

Also, in FIG. 7, a particular configuration of one of the pixel circuits is shown in order to simplify the illustration.

Referring to FIG. 7, the pixel circuit 101 according to the present embodiment includes a n-channel TFT 111 serving as a driving transistor, another n-channel TFT 112 serving as a switching transistor, a capacitor C111, a light-emitting element 113 formed from an organic EL light-emitting element (OLED: opto-electric device), a first node ND111, and a second node ND112.

In the pixel circuit 101, the TFT 111 serving as a driving transistor, the node ND111 and the light-emitting element (OLED) 113 are connected in series between a power driving line or power supply line PSL (101 to 10m) and a predetermined reference potential Vcat such as, for example, a ground potential.

In particular, the light-emitting element 113 is connected at the cathode and the anode thereof to the reference potential Vcat and the first node ND111, respectively, and the TFT 112 is connected at the source thereof to the first node ND111 and the TFT 111 is connected at the drain thereof to the power driving line PSL.

Further, the TFT 111 is connected at the gate thereof to the second node ND112.

Further, the first and second electrodes of the capacitor C111 are connected to the first and second nodes ND111 and ND112, respectively.

The source and the drain of the TFT 112 are connected to a signal line SGL and the second node ND112, respectively. Further, the gate of the TFT 112 is connected to the scanning line WSL.

In this manner, in the pixel circuit 101 according to the present embodiment, the capacitor C111 as a pixel capacitor is connected between the gate and the source of the TFT 111 serving as a driving transistor.

Figure 8:
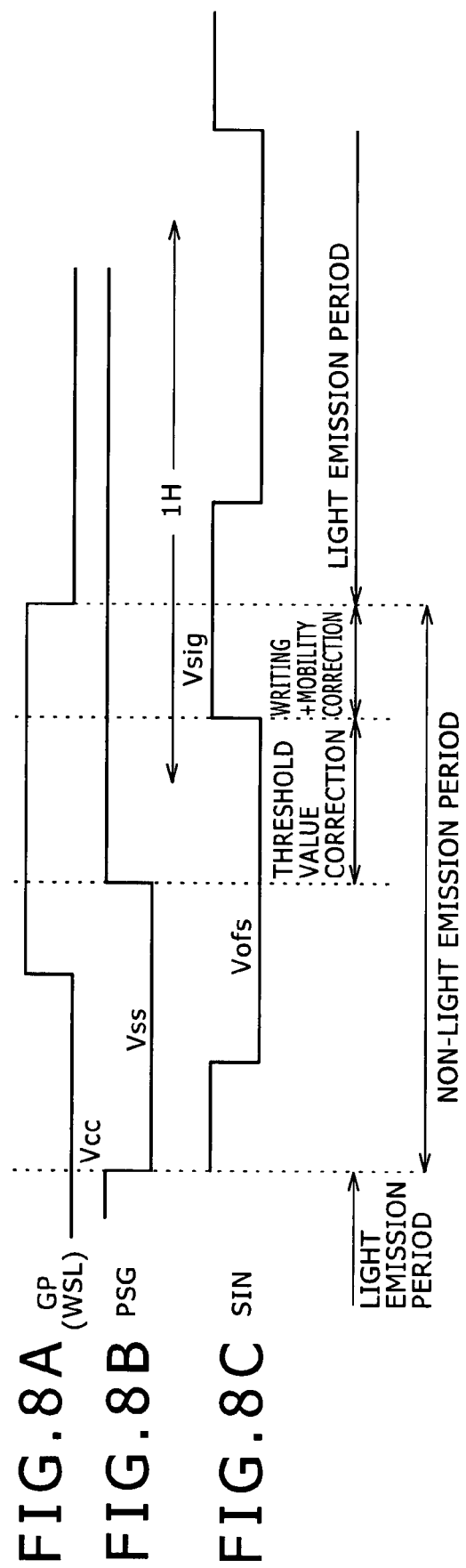
FIGS. 8A to 8C are timing charts illustrating a basic operation of the pixel circuit shown in FIG. 7.

FIGS. 8A to 8C are timing charts illustrating a basic operation of the pixel circuit shown in FIG. 7.

More particularly, FIG. 8A illustrates a gate pulse or scanning pulse GP to be applied to the scanning line WSL; FIG. 8B illustrates a power signal PSG to be applied to the power driving line PSL; and FIG. 8C illustrates an input signal SIN to be applied to the signal line SGL.

Referring to FIGS. 8A to 8C, in order to cause the light-emitting element 113 of the pixel circuit 101 to emit light, a power signal Vss, which may be, for example, a negative voltage, is applied to the power driving line PSL within a non-light emission period. Further, an offset signal Vofs is propagated to the signal line SGL so that it is inputted to the second node ND112 through the TFT 112. Thereafter, a power signal Vcc which corresponds to a power supply voltage is applied to the power driving line PSL to correct the threshold value of the TFT 111.

Thereafter, a data signal Vsig according to luminance information is applied to the signal line SGL and written into the second node ND112 through the TFT 112. At this time, since the writing is performed while current is applied to the TFT 111, a mobility correction is performed concurrently.

Then, the TFT 112 is placed into a non-conductive state and the light-emitting element 113 emits light in response to the luminance information.

Incidentally, as the increase in size and definition of a panel advances, defects such as short-circuiting between wiring lines or short-circuiting between layers increase.

Particularly, if short-circuiting between the layers or short-circuiting in the same layer occurs with signal lines or gate lines, then a line defect appears on a display image, resulting in the decreased yield.

Therefore, though not shown in FIGS. 6 and 7, in the present embodiment, the following countermeasure is taken in order to achieve an increase of that yield of a panel. In particular, not one original signal line but a plurality of signal lines (in the present embodiment, two signal lines) are wired in parallel to each other for each pixel column. Consequently, even if a signal line SGL and a scanning line (or gate line WSL) are short-circuited or opened to make a pixel circuit defective, for example, after fabrication, the two signal lines are connected to each other and cut at desired portions such that the defective pixel circuit is bypassed.

First to third examples of the countermeasure are described below.

Figure 9:
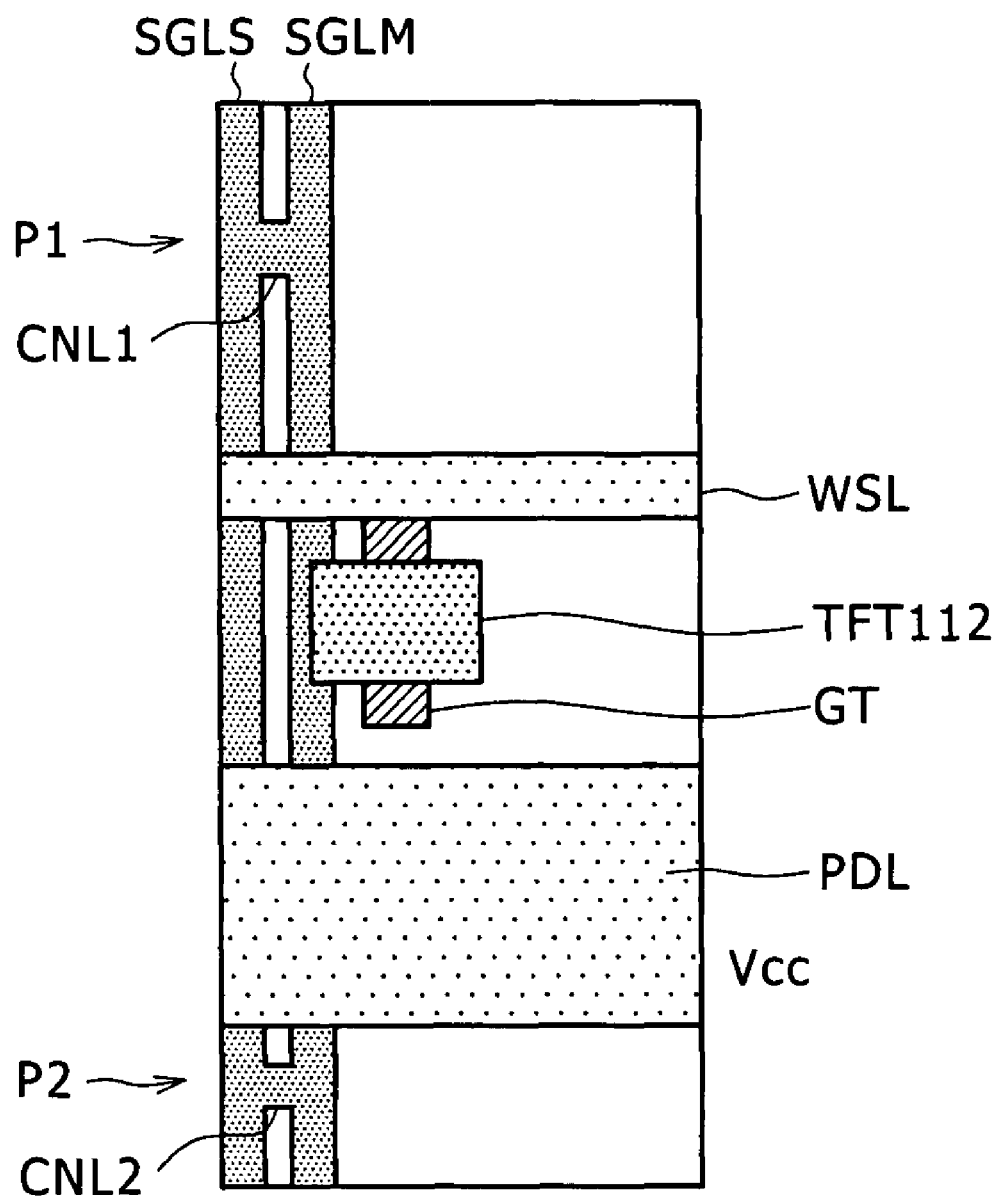
FIG. 9 is a schematic top plan view showing part of the pixel circuit shown in FIG. 7 and illustrating an example of a first countermeasure for achieving an improvement of the yield of a panel.

FIG. 9 schematically shows part of a pixel circuit and illustrates a first example of the countermeasure which achieves an increase of the yield of a panel.

Figure 10:
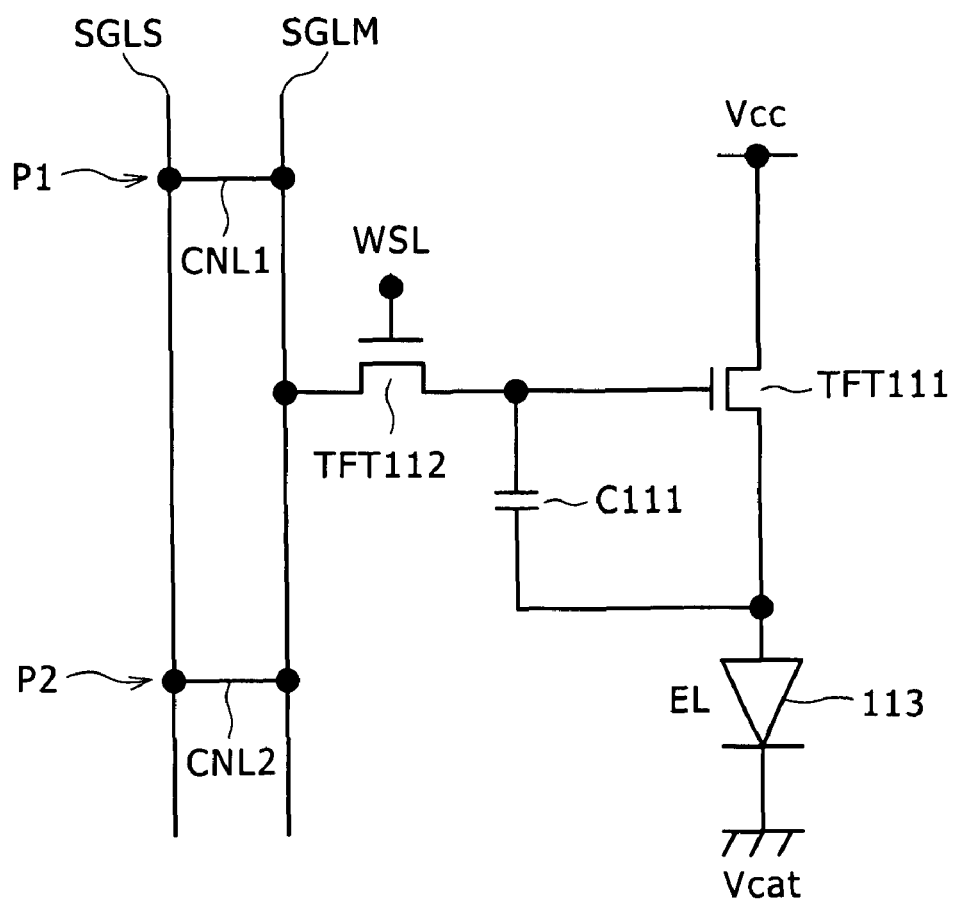
FIG. 10 is a circuit diagram schematically showing an equivalent circuit of the pixel circuit shown in FIG. 7 and illustrating the example of the first countermeasure shown in FIG. 9.

FIG. 10 shows a schematic circuit equivalent to the pixel circuit and illustrates the first countermeasure example.

Referring to FIGS. 9 and 10, in the first countermeasure example, a plurality of signal lines, in the present embodiment, an original main signal line SGLM and a sub-signal line SGLS, is wired in parallel to each other. The main signal line SGLM and the sub-signal line SGLS are connected like a ladder through connection wiring lines CNL1 and CNL2 at two predetermined first and second positions P1 and P2 across the pixel circuit in a wiring direction of the signal lines.

It is to be noted that, in FIGS. 9 and 10, the second position P2 is selected as a position which does not overlap with the power signal line PSL which serves as a power supply line.

Figure 11:
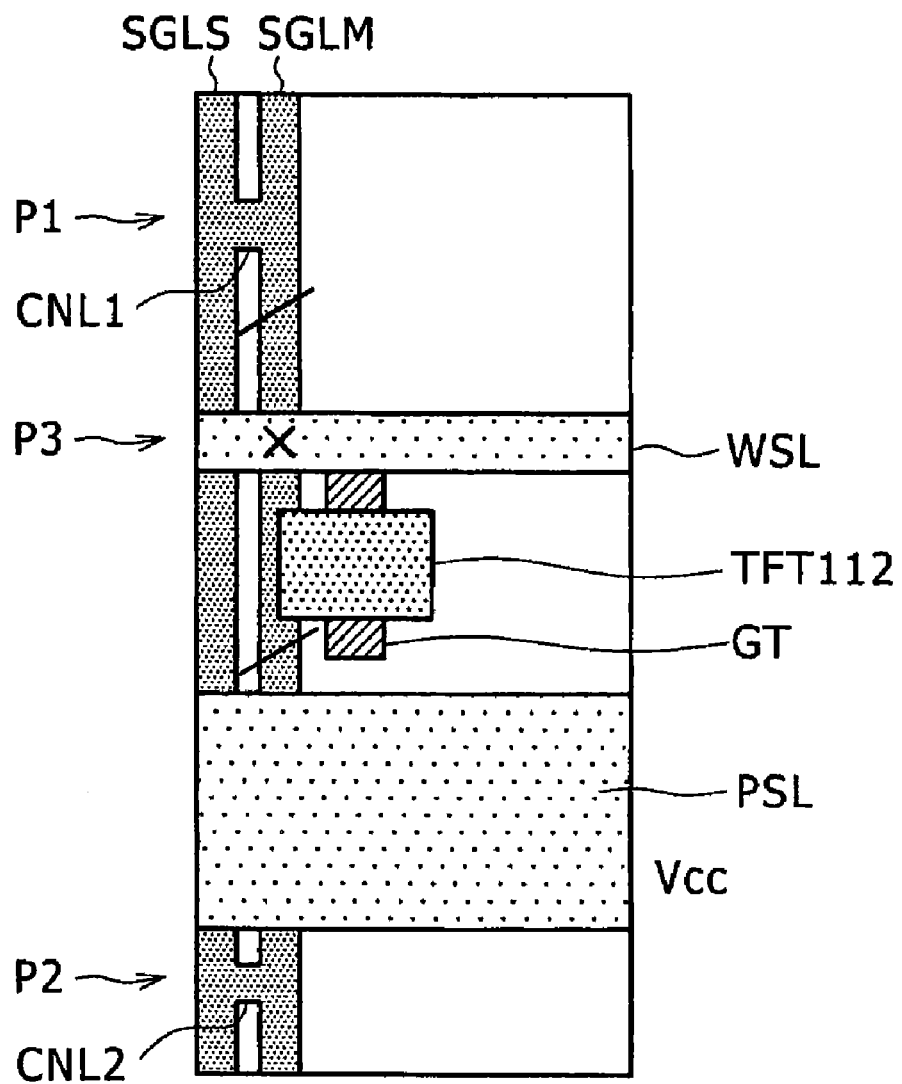
FIG. 11 is a schematic view illustrating a method (fabrication method) of bypassing a defective pixel circuit in the example of the first countermeasure shown in FIG. 9.

FIG. 11 illustrates a method (fabrication method) wherein a defective pixel circuit in the example of the first countermeasure is bypassed.

In the method illustrated in FIG. 11, short-circuiting between the scanning line (or gate line) to which the gate of the TFT 112 of the pixel circuit 101 is connected and the main signal line SGLM occurs at a position P3.

In this instance, in order to achieve bypassing of the defective pixel circuit, the main signal line SGLM is cut at a predetermined portion thereof between the positions P1 and P3 and also at another predetermined portion between the positions P2 and P3. Consequently, the main signal line SGLM between the positions P1 and P2 is replaced with the sub-signal line SGLS.

In other words, in the first countermeasure example, a method is applied wherein a portion at which short-circuiting or opening occurs is cut such that a line defect is converted into a point defect.

Figure 12:
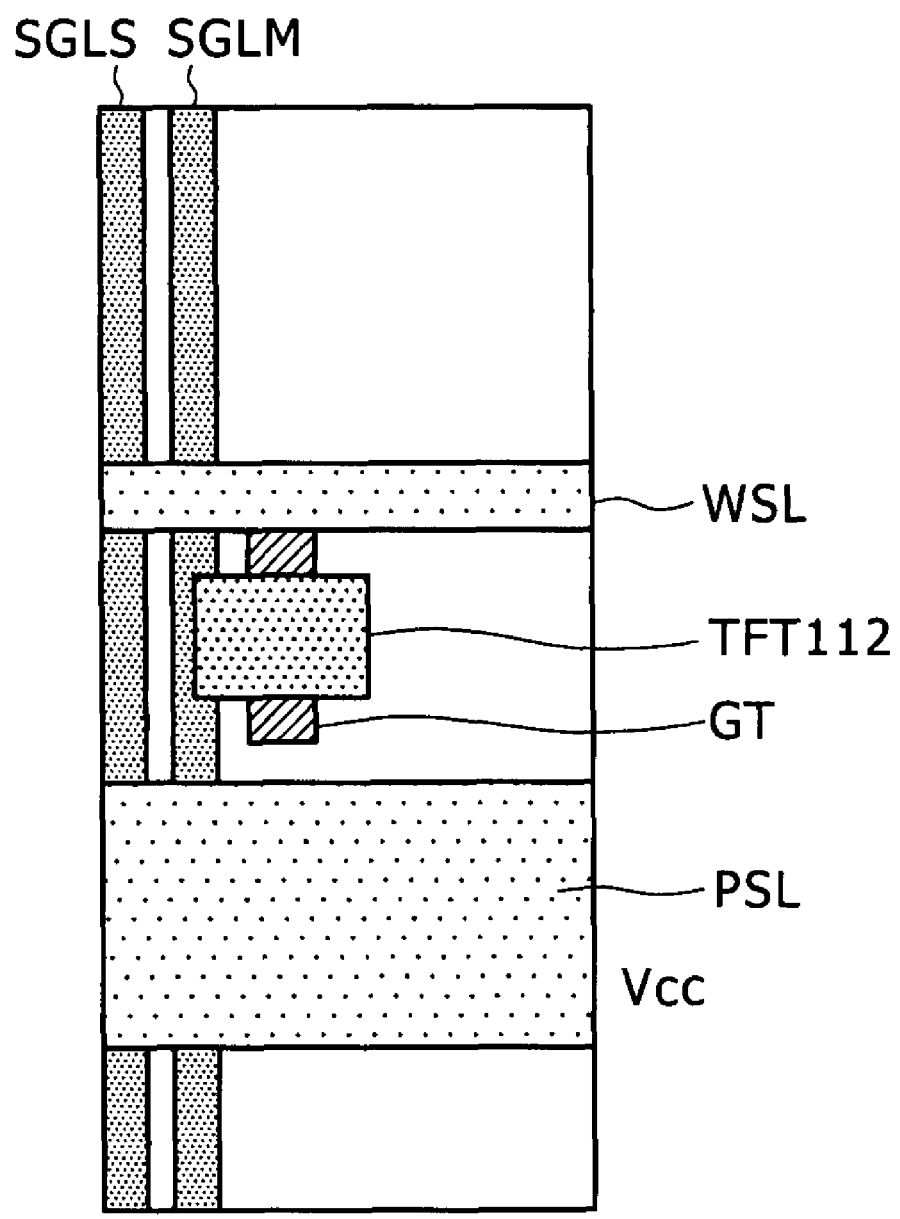
FIG. 12 is a schematic top plan view showing part of the pixel circuit shown in FIG. 7 and illustrating an example of a second countermeasure for achieving an improvement of the yield of a panel.

FIG. 12 schematically shows part of a pixel circuit and illustrates a second example of the countermeasure which achieves an increase of the yield of a panel.

Figure 13:
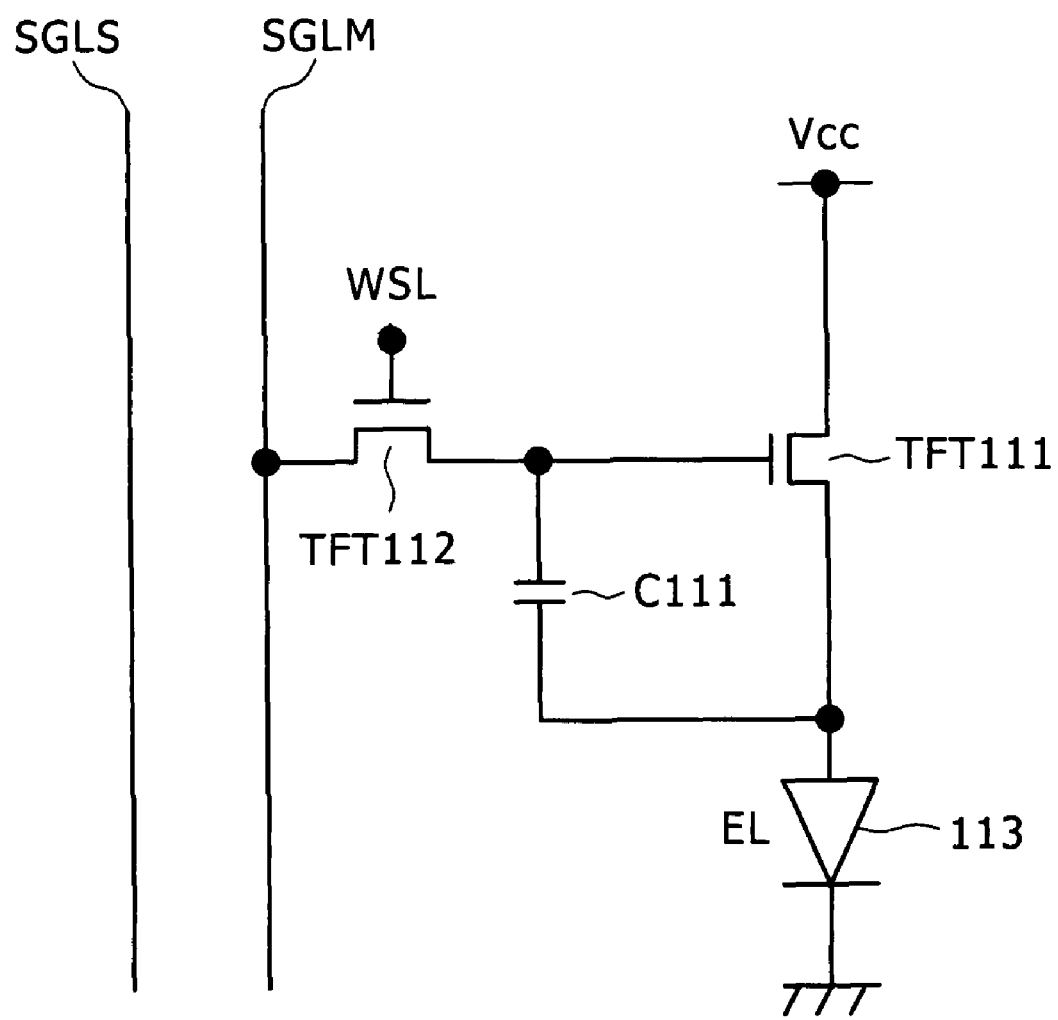
FIG. 13 is a circuit diagram schematically showing an equivalent circuit of the pixel circuit shown in FIG. 7 and illustrating the example of the second countermeasure shown in FIG. 12.

FIG. 13 shows a schematic equivalent circuit to the pixel circuit and illustrates the second countermeasure example.

The second countermeasure example is different from the first countermeasure example in that, while a plurality of signal lines, in the present embodiment, an original main signal line SGLM and a sub-signal line SGLS, are wired in parallel to each other as seen in FIGS. 12 and 13, the signal lines are not connected like a ladder through the connection wiring lines CNL1 and CNL2 at two predetermined positions P1 and P2 across the pixel circuit in the wiring direction of the signal line.

Then, where the pixel circuit is defective, a cutting process of the main signal line SGLM and a connection process of the connection wiring lines CNL1 and CNL2 at the positions P1 and P2 are performed.

The reason why two signal lines including an original main signal line SGLM and a sub-signal line SGLS are wired in parallel to each other is described below.

While the pixel circuit of FIG. 7 is a 2Tr+1C pixel circuit including two transistors and one capacitor, in the 2Tr+1C pixel circuit, a signal line has to use two potentials including the offset potential Vofs and the data potential Vsig within a period 1H, as described hereinabove.

Therefore, the signal line may require a frequency equal to twice an ordinarily-necessary frequency. If, in this state, a plurality of signal lines are connected like a ladder within one pixel, as in the case of the first countermeasure example, then this increases the capacitance, which sometimes may be disadvantageous in reducing the power consumption.

Therefore, in the present second countermeasure example, two signal lines including an original main signal line SGLM and a sub-signal line SGLS are merely wired in parallel to each other.

Figure 14:
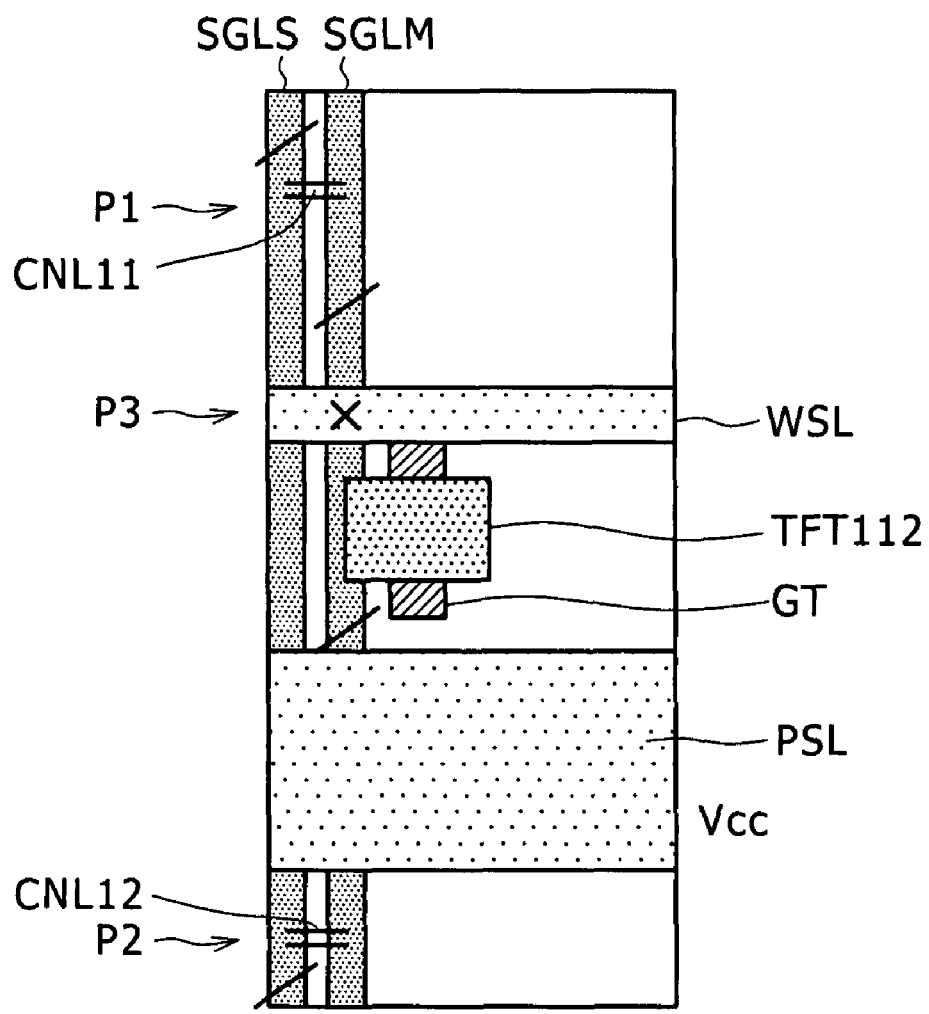
FIG. 14 is a schematic view illustrating a method (fabrication method) of bypassing a defective pixel circuit in the example of the second countermeasure shown in FIG. 12.

FIG. 14 illustrating a method, that is, a fabrication method, wherein the defective pixel circuit in the second countermeasure example is bypassed.

Also, in the example of FIG. 14, a scanning line (or gate line) WSL to which the gate of the TFT 112 of the pixel circuit 101 and the main signal line SGLM are short-circuited at a position P3, similarly as in the example of FIG. 11.

In this instance, in order to bypass the defective pixel circuit, the main signal line SGLM is cut at a predetermined point thereof between a position P1 and the position P3 and further cut at another predetermined point between a further position P2 and the position P3. Then, the main signal line SGLM and the sub-signal line SGLS are connected to each other at the position P1 by a connection wiring line CNL11 using a metal CVD method or the like. Besides, the main signal line SGLM and the sub-signal line SGLS are connected to each other at the second position P2 by a connection wiring line CNL12 using a CVD method or the like. Then, the sub-signal line SGLS is cut outside the processing region with respect to the position P1 and further cut outside the processing region with respect to the second position P2, thereby to replace the original main signal line SGLM between the first and second positions P1 and P2 with the sub-signal line SGLS.

With the second countermeasure example, not only the yield of a panel can be improved, but also it is possible to suppress the capacitance of the signal lines lower and achieve a reduction in power consumption of the driver.

Figure 15:
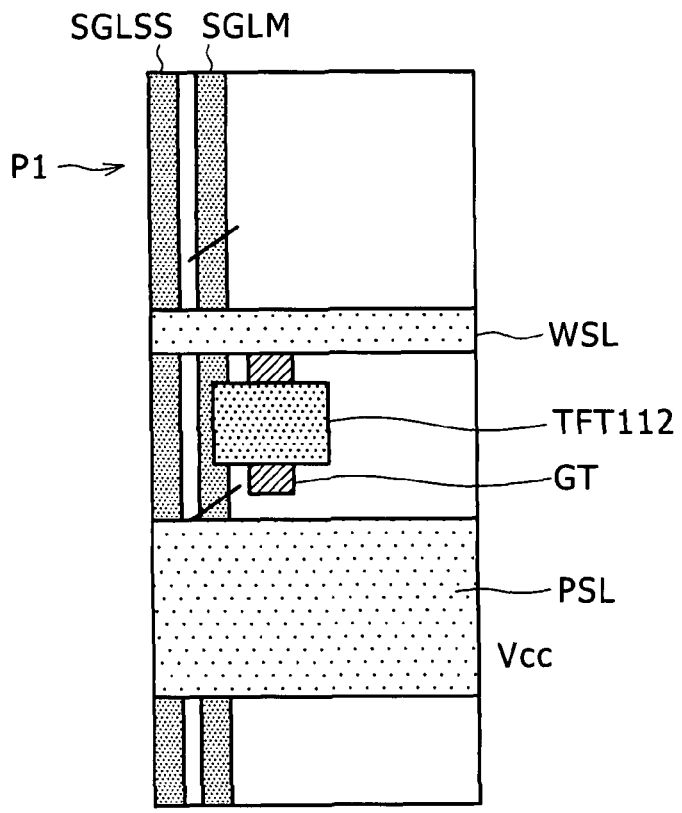
FIG. 15 is a schematic top plan view showing part of the pixel circuit shown in FIG. 7 and illustrating an example of a third countermeasure for achieving an improvement of the yield of a panel.

FIG. 15 schematically shows part of a pixel circuit and illustrates a third example of the countermeasure which achieves an increase of the yield of a panel.

Figure 16:
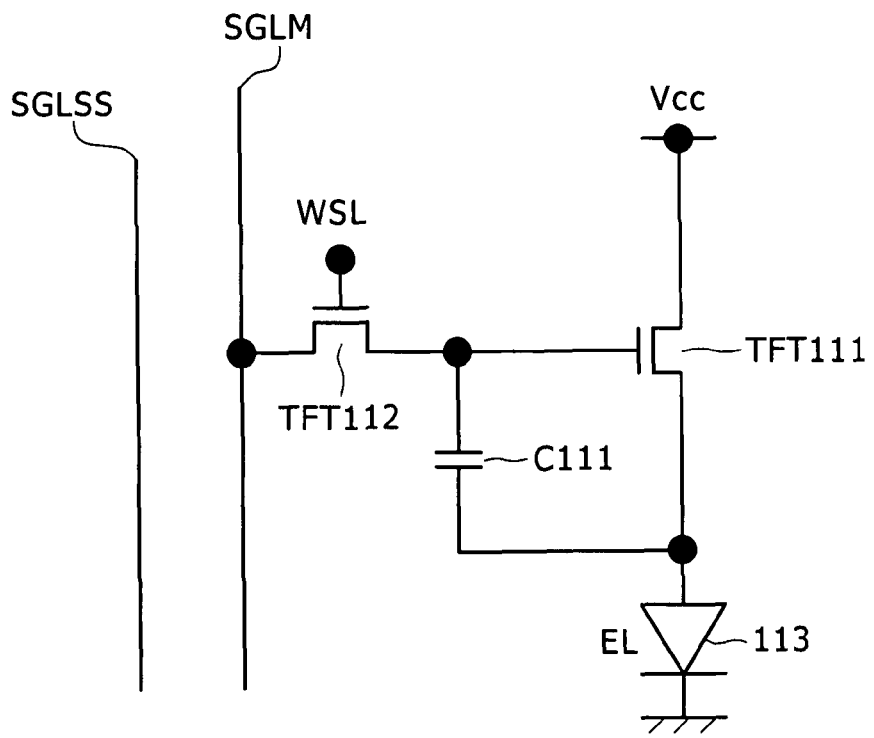
FIG. 16 is a circuit diagram schematically showing an equivalent circuit of the pixel circuit shown in FIG. 7 and illustrating the example of the third countermeasure shown in FIG. 15.

FIG. 16 shows a schematic circuit equivalent to the pixel circuit and illustrates the third countermeasure example.

The present third countermeasure example is different from the second countermeasure example described above in that, while a plurality of signal lines, in the present embodiment, two signal lines including an original main signal line SGLM and a sub-signal line SGLSs, are wired in parallel to each other as seen in FIGS. 15 and 16, the sub-signal line SGLSs is provided for each unit of one pixel in the wiring direction.

Figure 17:
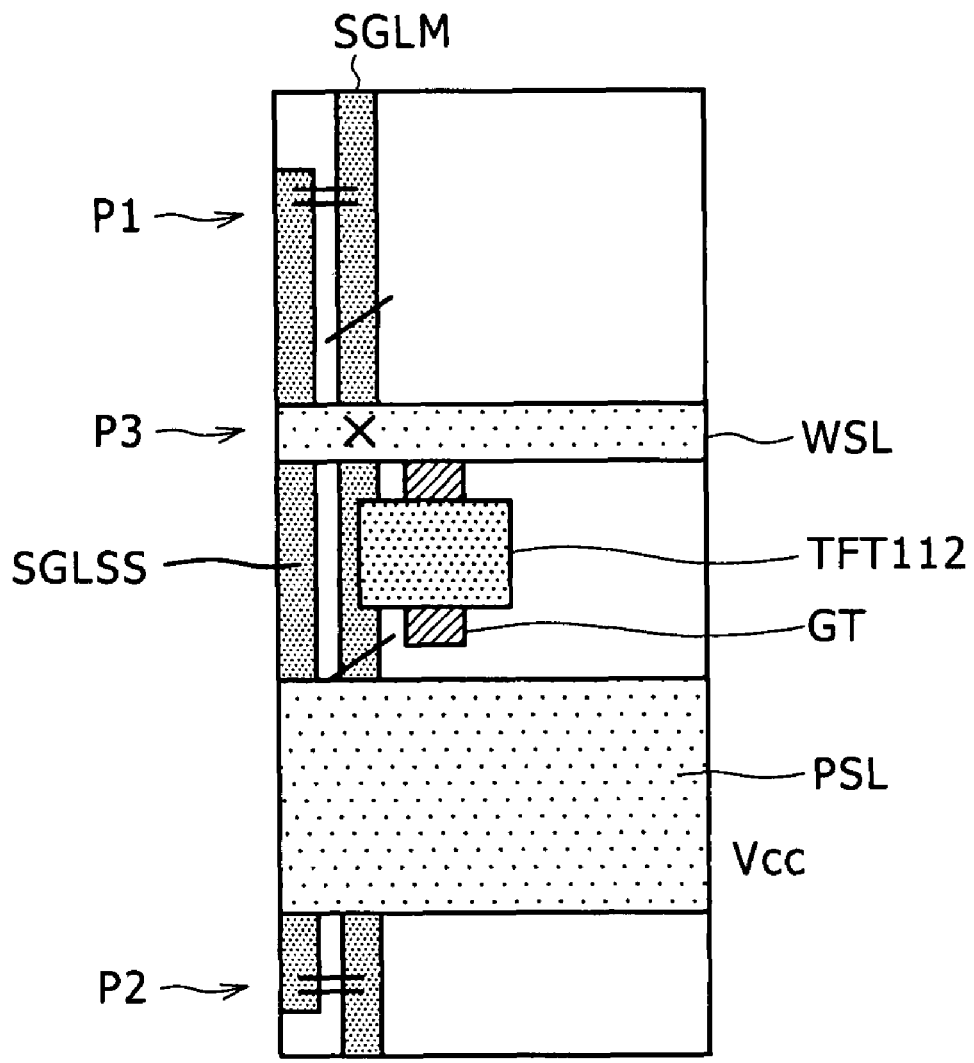
FIG. 17 is a schematic view illustrating a method (fabrication method) of bypassing a defective pixel circuit in the example of the third countermeasure shown in FIG. 15.

FIG. 17 illustrates a countermeasure method or fabrication method wherein a defective pixel circuit is bypassed in the third countermeasure example.

Also, in the example of FIG. 17, a scanning line (or gate line) WSL to which the gate of the TFT 112 of the pixel circuit 101 and the main signal line SGLM are short-circuited at a position P3 similarly as in the examples of FIGS. 11 and 14.

In this instance, in order to bypass the defective pixel circuit, the main signal line SGLM is cut at a predetermined point between a position P1 and the position P3 and further cut at another predetermined position between a further position P2 and the position P3. Then, the main signal line SGLM and the sub-signal line SGLS are connected to each other at the position P1 at one end of a sub-signal line SGLSS by a connection wiring line CNL11 using a metal CVD method or the like. Besides, the main signal line SGLM and the sub-signal line SGLS are connected to each other at the second position P2 at the other end of the sub-signal line SGLSS by a connection wiring line CNL12 using a CVD method or the like. Consequently, the main signal line SGLM between the first and second positions P1 and P2 is replaced with the sub-signal line SGLS.

With the third countermeasure example, since there is no necessity to cut the sub-signal line, the processing time for repair can be reduced. Therefore, the third countermeasure example is advantageous in that not only a reduction in power consumption of the driver, a reduction in cost and an enhancement of the yield can be achieved, but also it is possible to achieve a reduction of the cost by reducing the tact time.

Further, in the display apparatus 100 of the present embodiment, in order to achieve an improvement against shading and irregular striped patterns arising from a pulse delay caused by wiring line resistance and wiring line capacitance of a scanning line WSL, which is a wiring line for applying a driving pulse (or gate pulse) to the gate of a TFT (or transistor) in the pixel circuit 101, and/or in order to achieve an improvement against irregularities or roughness of an image caused by irregularities such as shading when the voltage of a power supply line drops, that is, in order to achieve an improvement of the picture quality, the following countermeasures are taken.

Figure 18:
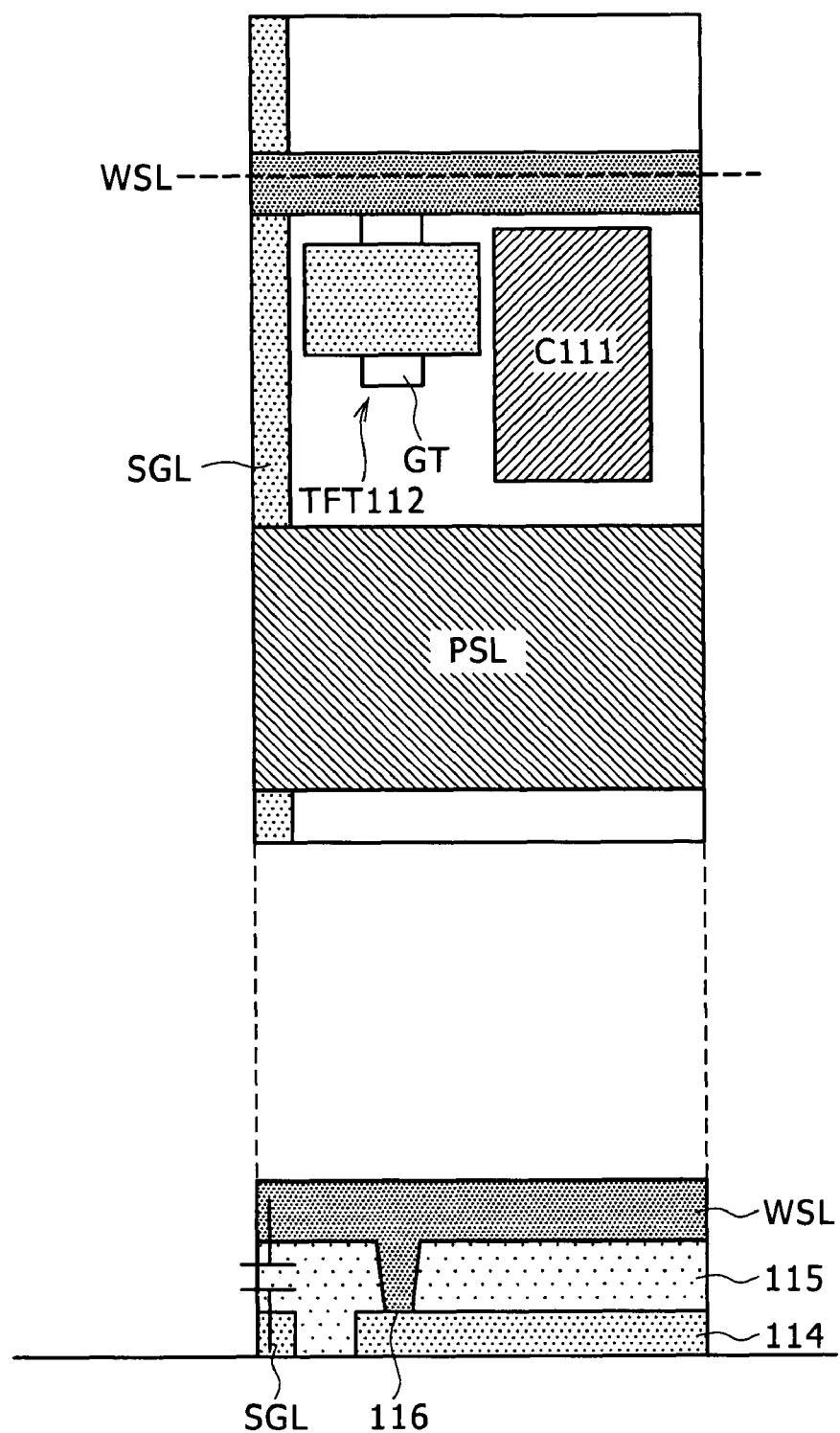
FIG. 18 is a schematic plan view and sectional view showing part of the pixel circuit shown in FIG. 7 and illustrating an example of a countermeasure for improving the picture quality and so forth.

FIG. 18 shows part of a pixel circuit and illustrates an example of the countermeasure for improving the picture quality and so forth.

Referring to FIG. 18, in the first countermeasure illustrated, a scanning line (or gate line) WSL to which the gate GT of the TFT 112 serving as a switching transistor in each pixel circuit 101 is connected is a wiring line of the same material and in the same layer as those of a power supply line (or power signal line) PSL formed from a metal of low resistance such as, for example, aluminum (Al). Meanwhile, a signal line SGL formed from a metal of low resistance such as, for example, aluminum (Al) is formed in a lower layer, that is, a substrate side layer (not shown), than that of the scanning line WSL and the power supply line PSL.

Then, the scanning line (or gate line) WSL in the upper layer and a low-resistance wiring line layer 114 which is in the same layer and is made of the same material as those of the signal line SGL, which is in the layer lower than that of the scanning line WSL, are connected to each other through a contact hole 116 formed in an interlayer insulating film 115 made of SIN or $SiO_2$, thereby to form a two-stage wiring structure.

Further, in the present first countermeasure example, a capacitor C111 is disposed at a position displaced so as not to overlap with the scanning line WSL in the layering direction of the layers.

It is to be noted that the TFT 112 in each pixel circuit is of the bottom gate type, and the gate electrode (control terminal) thereof is pulled up with respect to a contact formed on the insulating film (not shown) so as to be connected to the scanning line WSL.

Generally, the gate electrode of a TFT is formed as a film by high-resistance wiring, for example, by such a method as sputtering of metal or alloy of molybdenum (Mo), tantalum (Ta) or the like.

As described above, in the present countermeasure example, the scanning line (or gate line) WSL is laid out in two-stage wiring including a layer the same as that of the power supply line of low resistance and the layer of the interlayer insulating film 115 the same as that of the signal line.

With the countermeasure example having such a characteristic as just described above, the resistance and the capacitance of the scanning line (or gate line) WSL can be reduced. In particular, the wiring line layer which forms power supply lines and also the wiring line layer which forms signal lines SGL are formed from low-resistance metal. Therefore, by the employment of the two-stage wiring lines, the resistance of the scanning lines WSL can be reduced to approximately a half. Consequently, the transient of the gate line for the TFTs 112 as switching transistors can be accelerated.

Further, the difference in pulse width between gate pulses GP at the output end of the gate pulse (or control signal) GP of the writing scanner 104 to the scanning lines WSL and a position spaced from the output end can be reduced. Consequently, it is possible to obtain an uniform picture quality free from insufficient writing, irregularities and shading.

Thus, there is an advantage that the transient of the gate line can be accelerated and a higher definition can be anticipated.

FIG. 19 shows a configuration as a comparative example with the configuration of FIG. 18, wherein a capacitor is disposed at a position overlapping with a scanning line (or gate line) in a layering direction of layers.

Where the configuration wherein a capacitor or a signal line is disposed at a position overlapping with a scanning line WSL in the layering direction of layers, as seen in FIG. 19, there is a tendency that the parasitic capacitance of the scanning lines (or gate line) WSL increases.

In contrast, where the capacitor C111 is disposed at a position displaced so as not to overlap with the scanning line WSL in the layering direction of the layers, as in the present countermeasure example, only the signal lines are disposed in an overlapping relationship under the scanning lines WSL. Consequently, an increase of the parasitic capacitance can be prevented, and further acceleration of the propagation speed of a gate pulse can be implemented.

Figure 20:
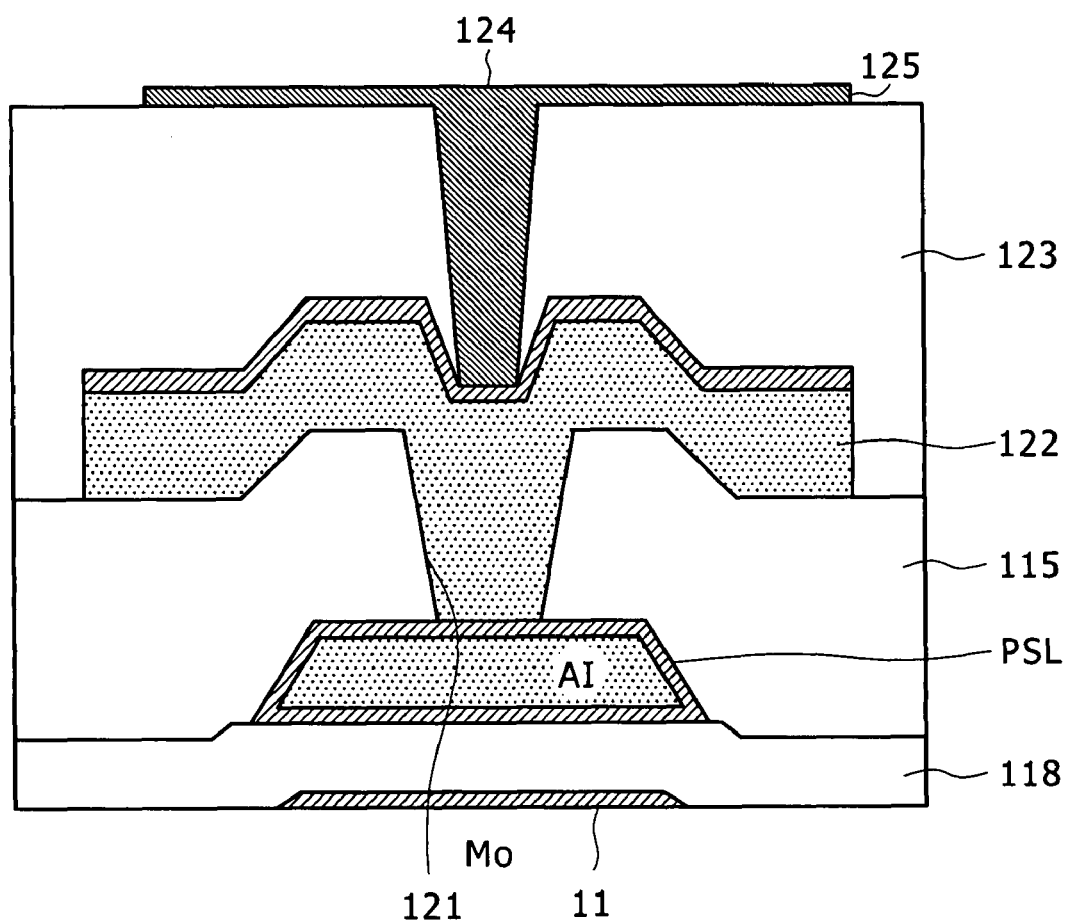
FIG. 20 is a sectional view schematically showing part of the pixel circuit shown in FIG. 7 and illustrating another example of the countermeasure for improving the picture quality and so forth.

FIG. 20 shows part of a pixel circuit and illustrates another countermeasure example for improvement in the picture quality and so forth.

In the present countermeasure example, power supply lines (or power driving lines) PSL are disposed in multiple layers in order to achieve an improvement against the appearance of irregularities or roughness on an image caused by irregularities such as shading when the voltage of the power supply lines drops.

As described hereinabove, the original power supply line PSL is formed from a low-resistance wiring line of the same material (or Al or the like) and in the same layer as those of the scanning line (or gate line) WSL at a predetermined position of a gate insulating film 118.

Further, a contact hole 121 is formed in the interlayer insulating film 115 formed on the power supply line PSL. Further, a low-resistance wiring line layer 122 of Al or the like formed on the interlayer insulating film 115 is connected to the power supply line PSL through the contact hole 121 to form a multilayer structure. Further, the power supply lines are formed in a two-stage wiring line structure to achieve a reduction in resistance, thereby to achieve an improvement against the appearance of irregularities or roughness on an image caused by irregularities such as shading when the voltage of the power supply lines drops.

For example, a flattening film 123 is formed on the low-resistance wiring line layer 122 of an upper layer and a contact hole 124 is formed in the flattening film 123. The low-resistance wiring line layer 122 is connected to the anode electrode 125 formed on the flattening film 123 through the contact hole 124.

With the present countermeasure example, it is possible to prevent the appearance of irregularities or roughness on an image caused by irregularities such as shading when the voltage of the power supply lines drops.

Now, a more particular operation of the configuration described above, principally of a pixel circuit, is described with reference to FIGS. 21A to 21E and 22 to 29.

Figure 21:
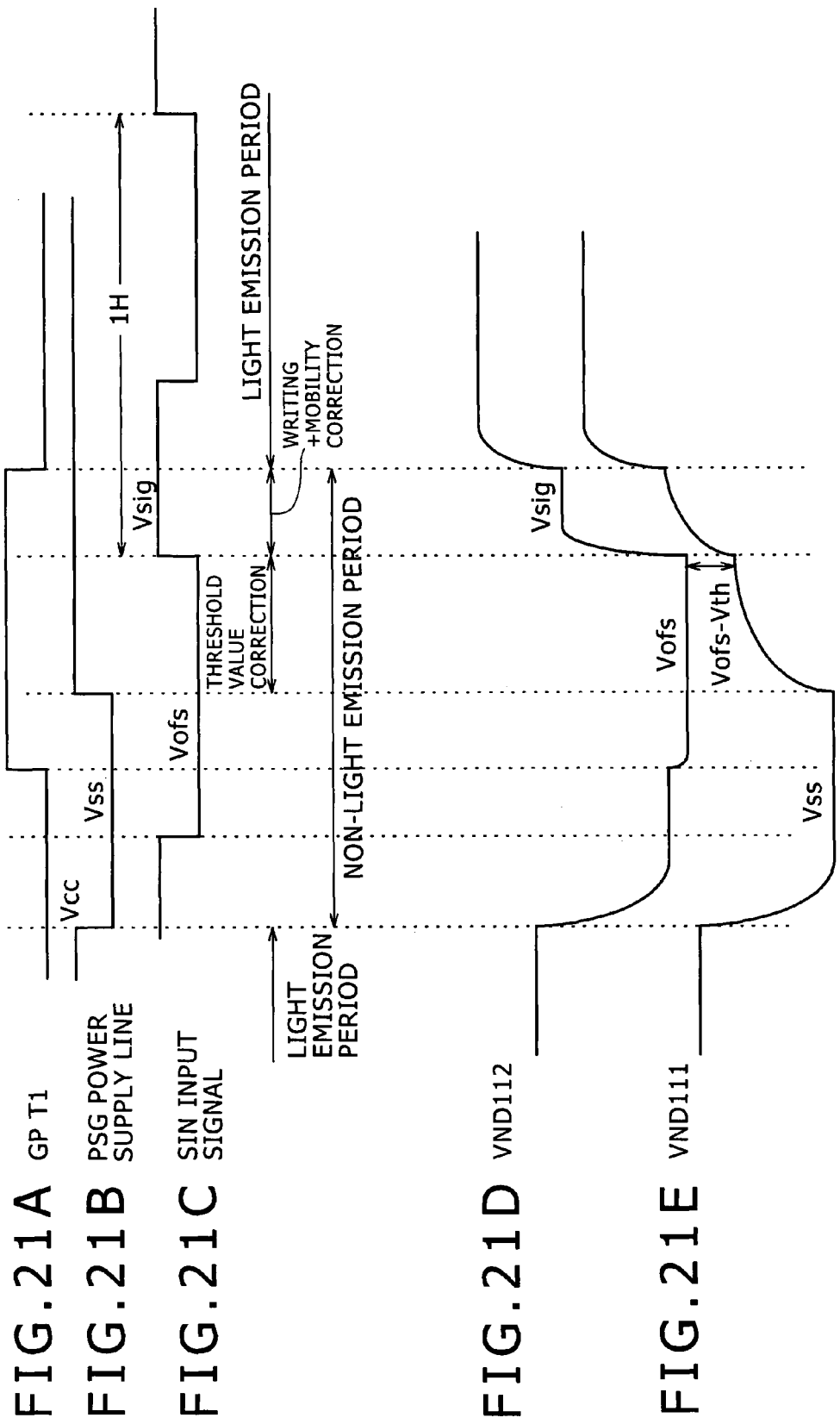
FIGS. 21A to 21E are timing charts illustrating a particular operation of the pixel circuit shown in FIG. 7.

It is to be noted that FIG. 21A illustrates a gate pulse (or scanning pulse) GP applied to the scanning line WSL; FIG. 21B illustrates a power signal PSG applied to the power driving line PSL; FIG. 21C illustrates an input signal SIN applied to the signal line SGL; FIG. 21D illustrates a potential VND112 at the second node ND112; and FIG. 21E illustrates a potential VND111 at the first node ND111.

Figure 22:
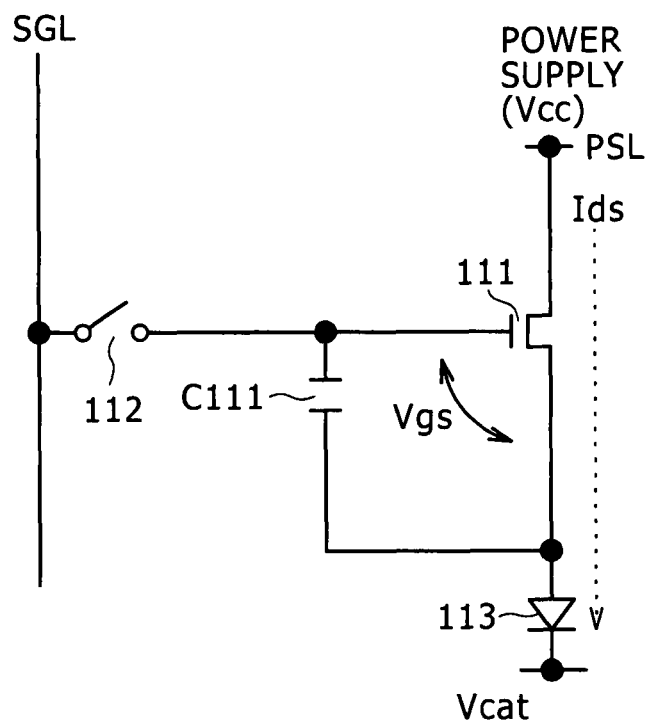
FIG. 22 is a circuit diagram showing a state of the pixel circuit shown in FIG. 7 within a light emission period in operation of the pixel circuit.

First, when the EL light-emitting element 113 is in a light emitting state, the power supply voltage Vcc is applied to the power driving line PSL and the TFT 112 is in an off state as seen in FIGS. 21B and 22.

At this time, since the TFT 111 serving as a driving transistor is set so as to operate in a saturation region, the current Ids flowing through the EL light-emitting element 113 assumes a value indicated by the expression 1 in response to the gate-source voltage Vgs of the TFT 111.

Figure 23:
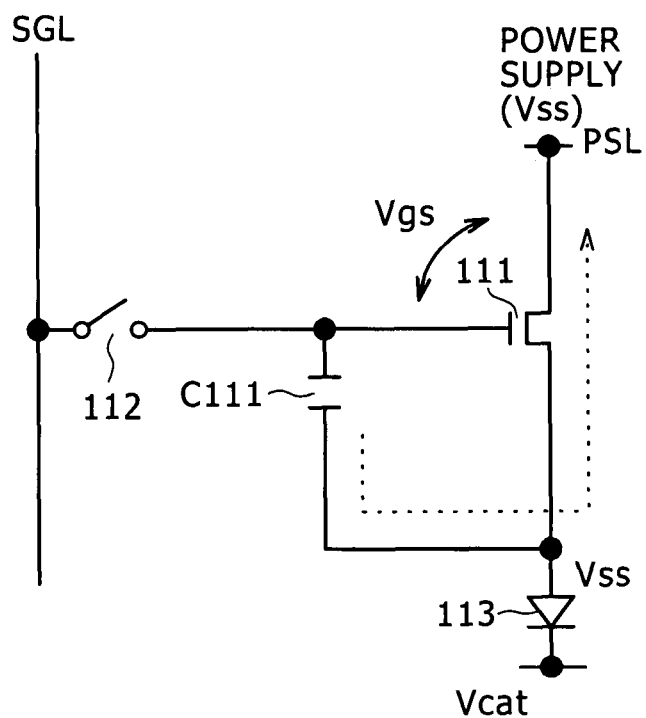
FIG. 23 is a similar view but showing the pixel circuit shown in FIG. 7 in a state wherein the voltage is set to a certain voltage within a non-light emission period in an operation of the pixel circuit.
Figure 24:
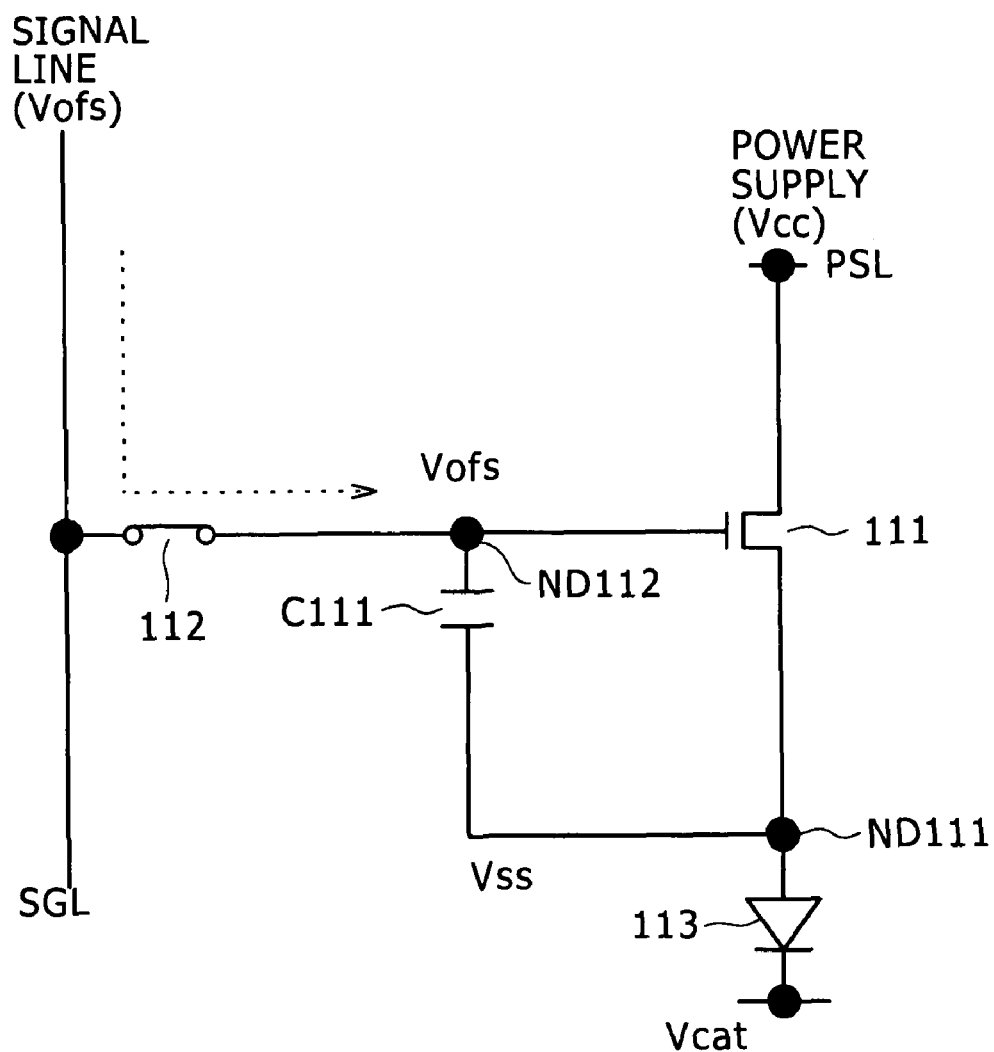
FIG. 24 is a similar view but showing the pixel circuit shown in FIG. 7 in a state wherein an offset signal is inputted in an operation of the pixel circuit.

Then, within a non-light emission period, a voltage Vss is applied to a power driving line PSL serving as a power supply line, as seen in FIGS. 21B and 23. At this time, if the voltage Vss is lower than the sum of a threshold value Vthel of the EL light-emitting element 113 and the cathode voltage Vcat, that is, if Vss<Vthel+Vcat is satisfied, then the EL light-emitting element 113 emits no light and the power driving line PSL serving as a power supply line acts as the source of the TFT 111 serving as a driving transistor. At this time, the anode of the EL light-emitting element 113, that is, the first node ND111, is charged to the voltage Vss, as seen in FIG. 21E.

Further, as seen in FIGS. 21A, 21C, 21D, 21E and 24, when the potential at the signal line SGL becomes equal to the offset voltage Vofs, the gate pulse GP is set to the high level to turn on the TFT 112 to set the gate potential of the TFT 111 to the offset voltage Vofs.

At this time, the gate-source voltage of the TFT 111 assumes a value of Vofs-Vss. Since the threshold-value correction operation may not be performed if the gate-source voltage (Vofs-Vss) of the TFT 111 is not equal to or higher than (is lower than) the threshold voltage Vth of the TFT 111, it is necessary to make the gate-source voltage (Vofs-Vss) of the TFT 111 higher than the threshold voltage Vth of the TFT 111, that is, so as to satisfy Vofs-Vss>Vth.

Figure 25:
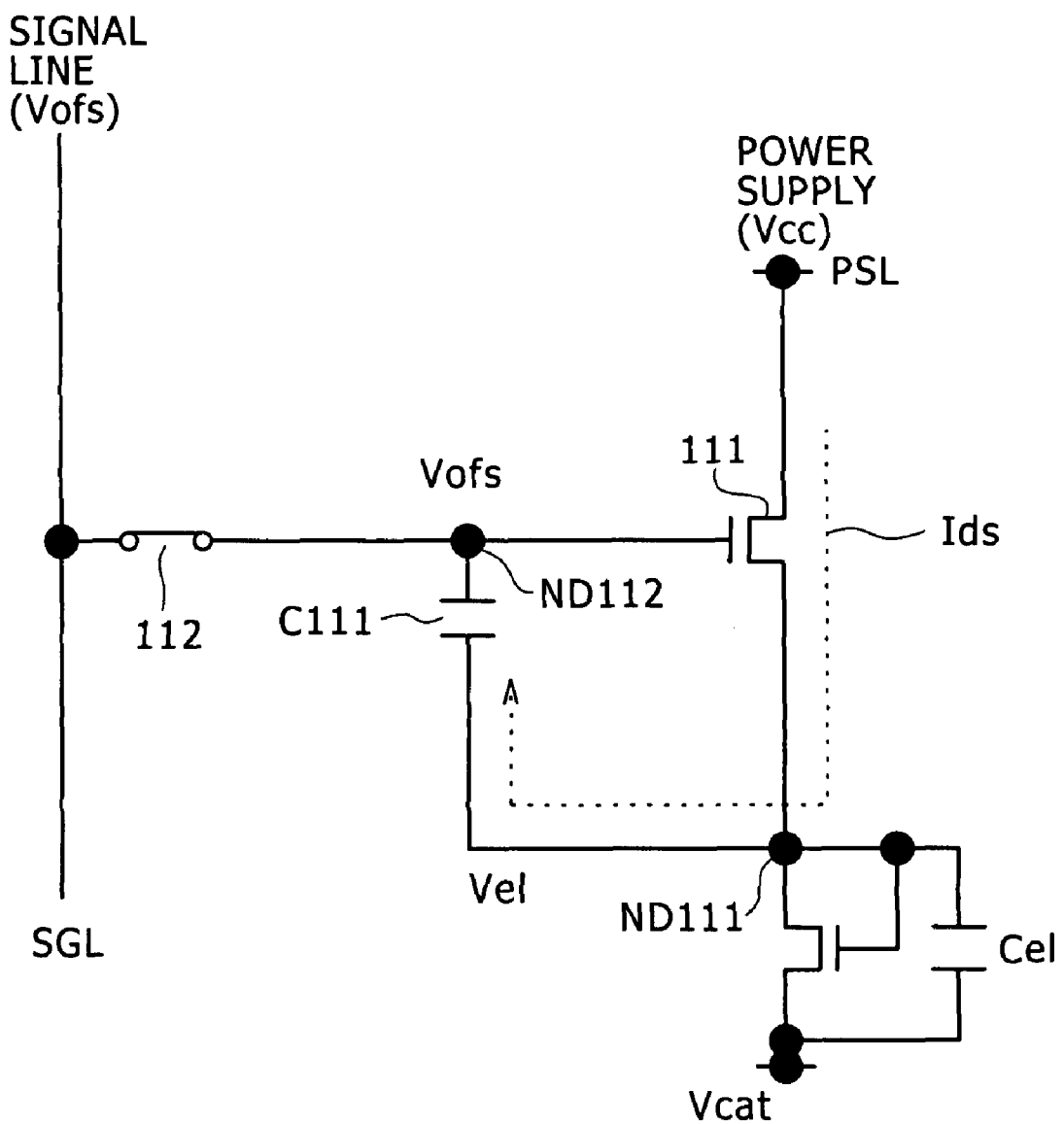
FIG. 25 is a similar view but showing the pixel circuit shown in FIG. 7 in a state wherein the voltage is set to a power supply voltage in an operation of the pixel circuit.

Then, in the threshold-value-correction operation, the power signal PSG to be applied to the power driving line PSL is set to the power supply voltage Vcc again.

Where the power driving line PSL is set to the power supply voltage Vcc, the anode (node ND111) of the EL light-emitting element 113 functions as the source of the TFT 111, and current flows as seen in FIG. 25.

Since the equivalent circuit to the EL light emitting element 113 can be represented by diodes and capacitors, as seen in FIG. 25, as far as the relationship of Vel≦Vcat+Vthel (the leak current of the EL light-emitting element 113 is considerably lower than the current flowing through the TFT 111) is satisfied, the current of the TFT 111 is used to charge the capacitors C111 and Cel.

Figure 26:
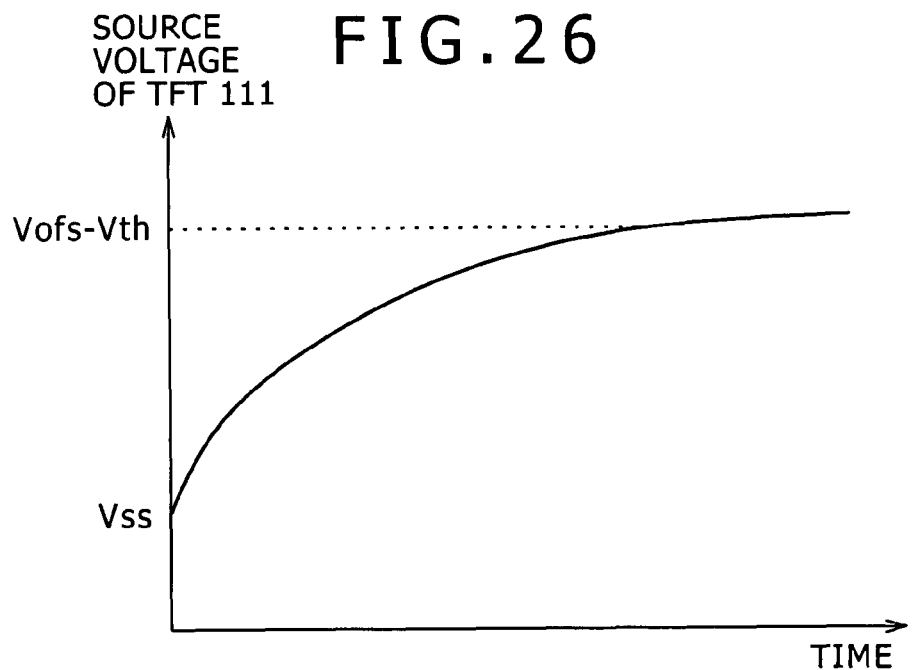
FIG. 26 is a diagram illustrating a transition of a source voltage of a driving transistor when the voltage is set to the power supply voltage in an operation of the pixel circuit in FIG. 7.

At this time, the voltage Vel between the terminals of the capacitor Cel rises as time passes, as seen in FIG. 26. After a lapse of a fixed interval of time, the gate-source voltage of the TFT 111 assumes the value of Vth. At this time, Vel=Vofs-Vth≦Vcat+Vthel is satisfied.

Figure 27:
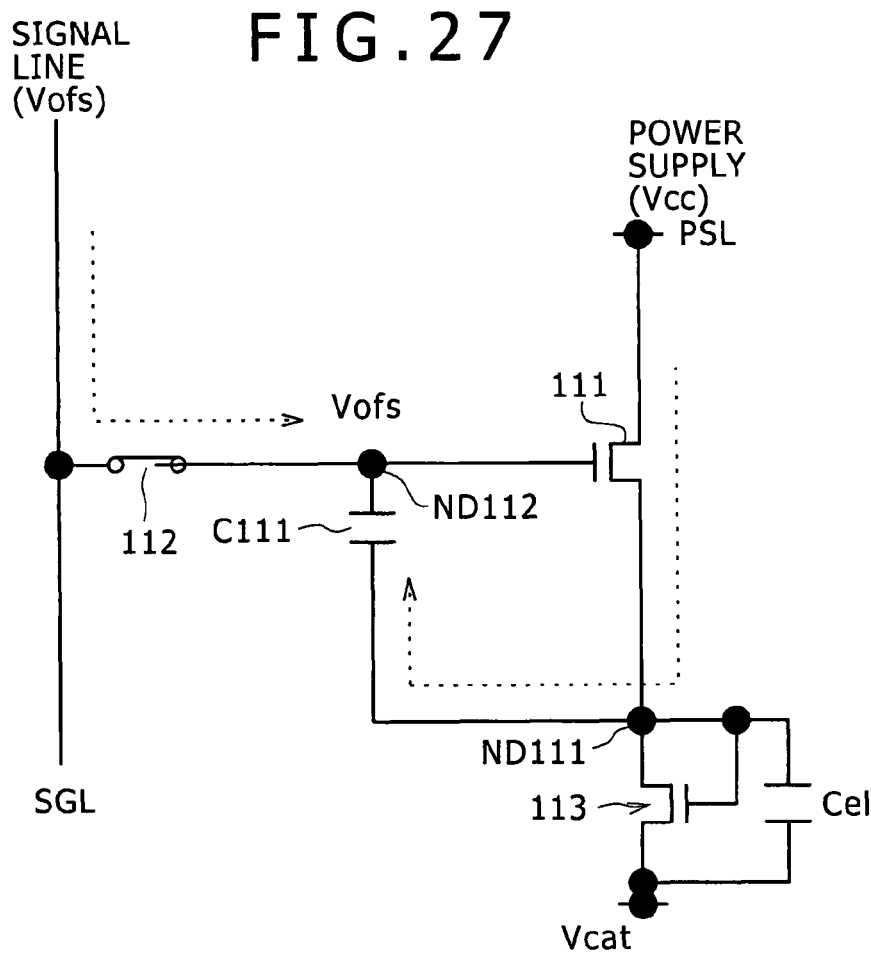
FIG. 27 is a circuit diagram showing the pixel circuit in FIG. 7 in a state wherein a data signal is written in an operation of the pixel circuit.

After the threshold value cancellation operation comes to an end, the potential at the signal line SGL is set to the voltage of the data signal Vsig while the TFT 112 is in an on state, as seen in FIGS. 21A, 21c and 27. The data signal Vsig has a value corresponding to a gradation. At this time, since the TFT 112 is on, the gate potential at the TFT 111 is equal to the potential of the data signal Vsig, as seen in FIG. 21D. However, since a current Ids flows from the power driving line PSL serving as a power supply line to the TFT 111, the source potential of the TFT 111 rises as time passes.

At this time, if the source voltage of the TFT 111 does not exceed the sum of the threshold voltage Vthel of the EL light-emitting element 113 and the cathode voltage Vcat, that is, if the leak current of the EL light-emitting element 113 is considerably lower than the current flowing through the TFT 111, then the current flowing through the TFT 111 is used to charge the capacitors C111 and Cel.

At this time, since the threshold value correction operation of the TFT 111 is completed, the current supplied from the TFT 111 reflects the mobility μ.

Figure 28:
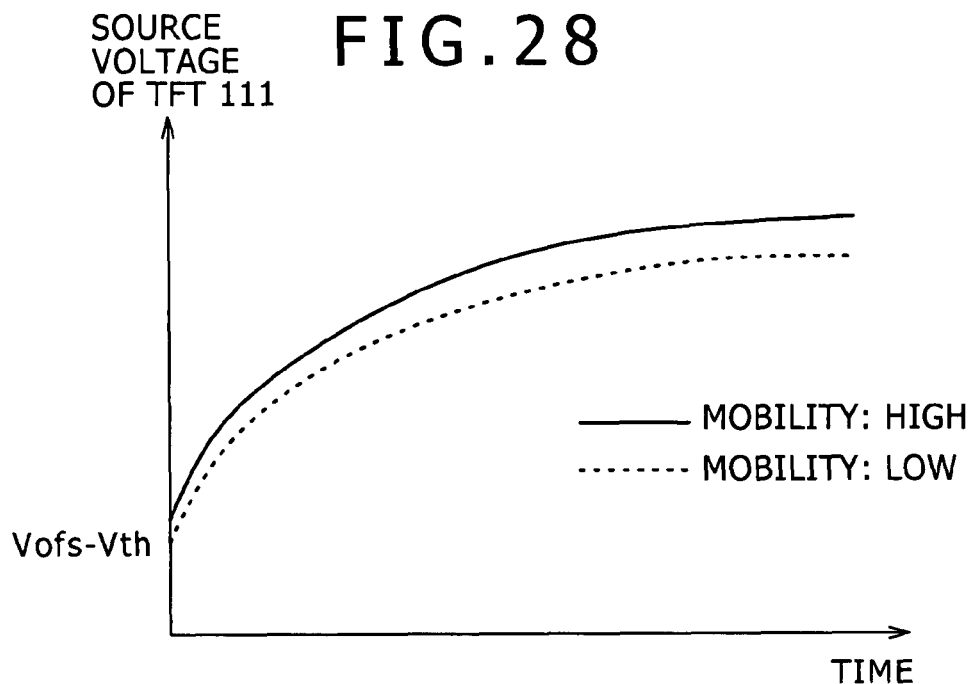
FIG. 28 is a diagram illustrating a transition of the source voltage of the driving transistor in response to the mobility in an operation of the pixel circuit in FIG. 7.
Figure 29:
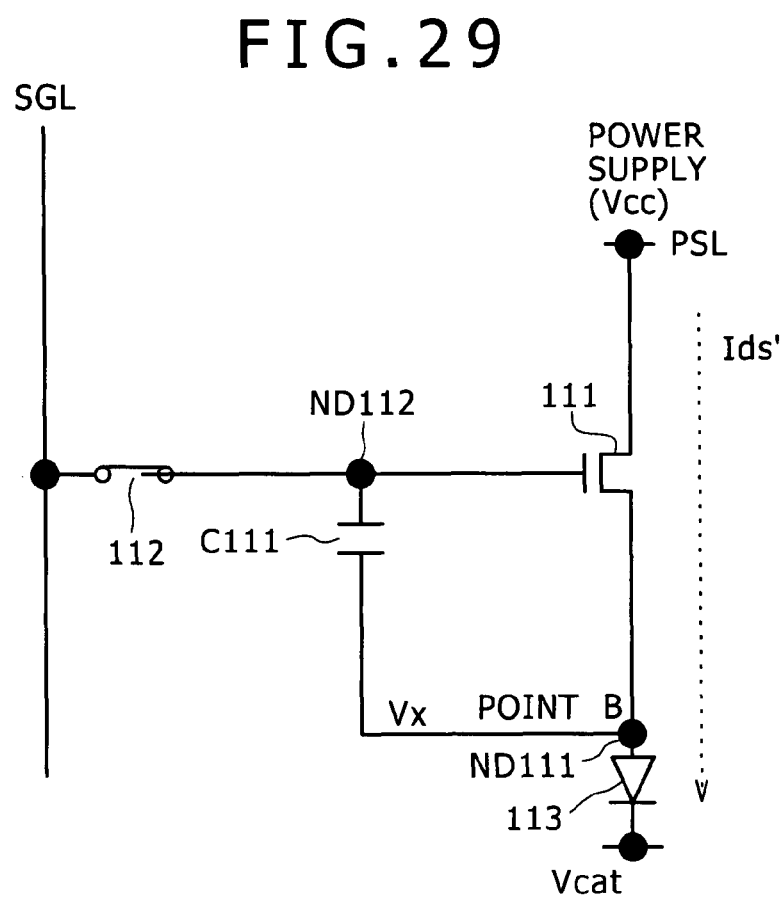
FIG. 29 is a circuit diagram showing the pixel circuit in FIG. 7 in a light emission state in an operation of the pixel circuit.

More particularly, as seen in FIG. 28, where the mobility p is high, also, the current amount is great and the rise of the source voltage is rapid. Consequently, the gate-source voltage of the TFT 111 decreases, reflecting the mobility p, and after a lapse of a fixed interval of time, the gate-source voltage becomes equal to the gate-source voltage Vgs with which the mobility is corrected fully.

Finally, as seen in FIGS. 21A to 21C and 29, the gate pulse GP is changed over to the low level to turn off the TFT 112 to end the writing and cause the EL light-emitting element 113 to emit light.

Since the gate-source voltage of the TFT 111 is fixed, the TFT 111 supplies fixed current Ids' to the EL light-emitting element 113, and the voltage Vel rises to a voltage Vx with which the fixed current Ids' flows through the EL light-emitting element 113, thereby to cause the EL light-emitting element 113 to emit light.

Also, in the present pixel circuit 101, as the light emission time becomes long, the I-V characteristic of the EL light-emitting element 113 varies. Therefore, also, the potential at a point B (first node ND111) in FIG. 29 varies. However, since the gate-source voltage of the TFT 111 is kept to the fixed value, the current flowing through the EL light-emitting element 113 does not vary. Therefore, even if the I-V characteristic of the EL light-emitting element 113 deteriorates, the fixed current Ids continues to flow and the luminance of the EL light-emitting element 113 is kept fixed.

In the pixel circuit driven in such a manner as described above, since it has such a configuration according to any of the first to third countermeasure examples as described above, an improvement of the yield of a panel can be achieved. Further, it becomes possible to suppress the capacitance of each signal line low and to achieve a reduction in power consumption of the driver.

Further, an image of a high picture with the appearance of shading, striped irregularities and so forth suppressed can be obtained.

As described above, in the description of the present first embodiment, the first to third countermeasure examples are described as countermeasures which can achieve an improvement of the yield of a panel for the display apparatus 100 which includes the circuit of FIG. 7, that is, a 2Tr+1C pixel circuit including two transistors and one capacitor.

However, while the first to third countermeasure examples are effective for the display apparatus 100 which includes a 2Tr+1C pixel circuit, it is also possible to apply the countermeasures to a display apparatus which includes a pixel circuit configured such that TFTs for mobility and for threshold value cancellation are provided separately in addition to a driving transistor or a switching transistor connected in series to an OLED.

In the following, from among such display apparatuses, a display apparatus which includes a 5Tr+1C pixel circuit including five transistors and one capacitor is described as a second embodiment of the present invention.

Figure 30:
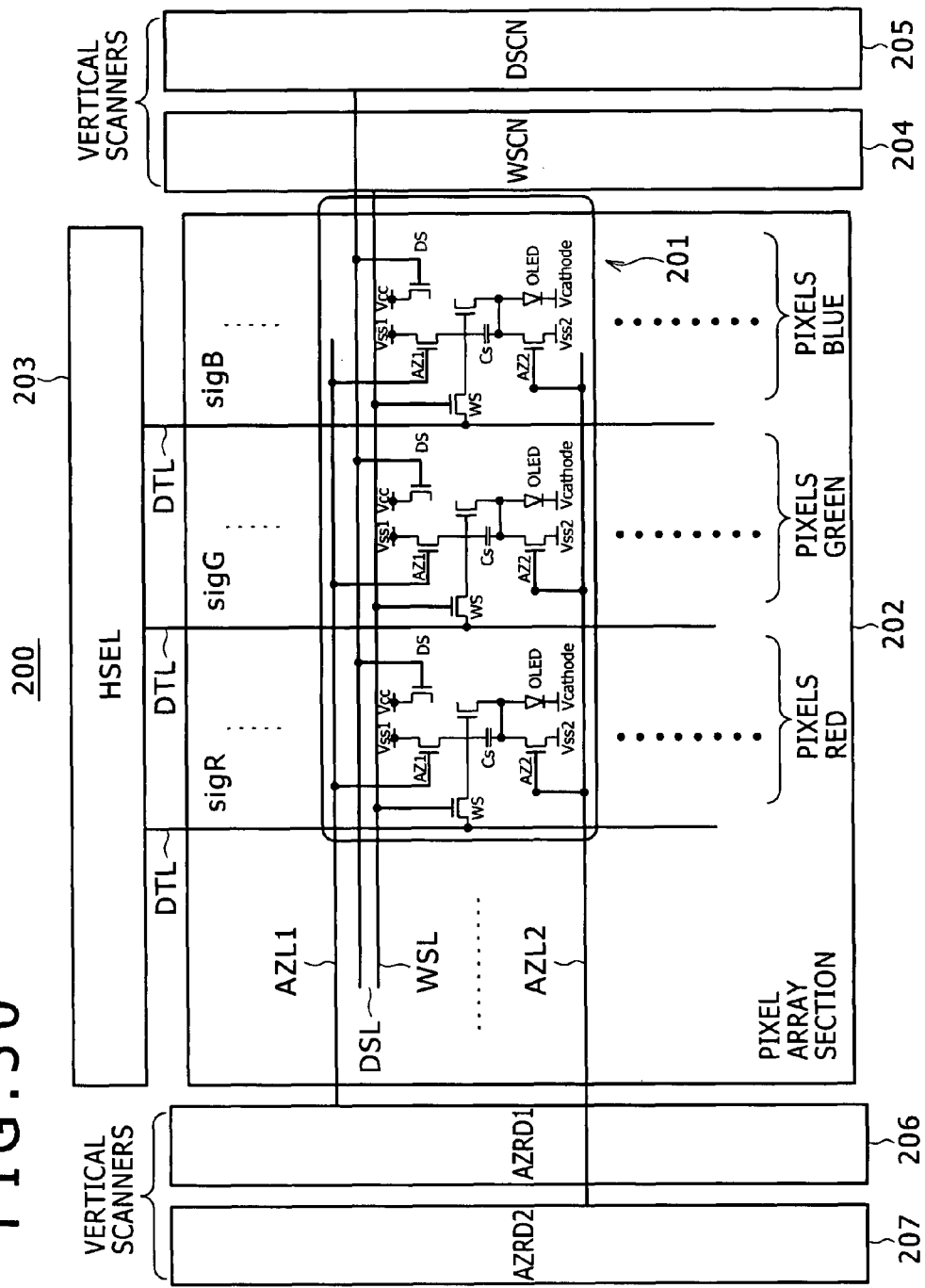
FIG. 30 is a block diagram showing a configuration of an organic EL display apparatus to which a pixel circuit according to a second embodiment of the present invention is applied.

FIG. 30 shows a configuration of an organic EL display apparatus which adopts the pixel circuit according to the second embodiment of the present invention.

Figure 31:
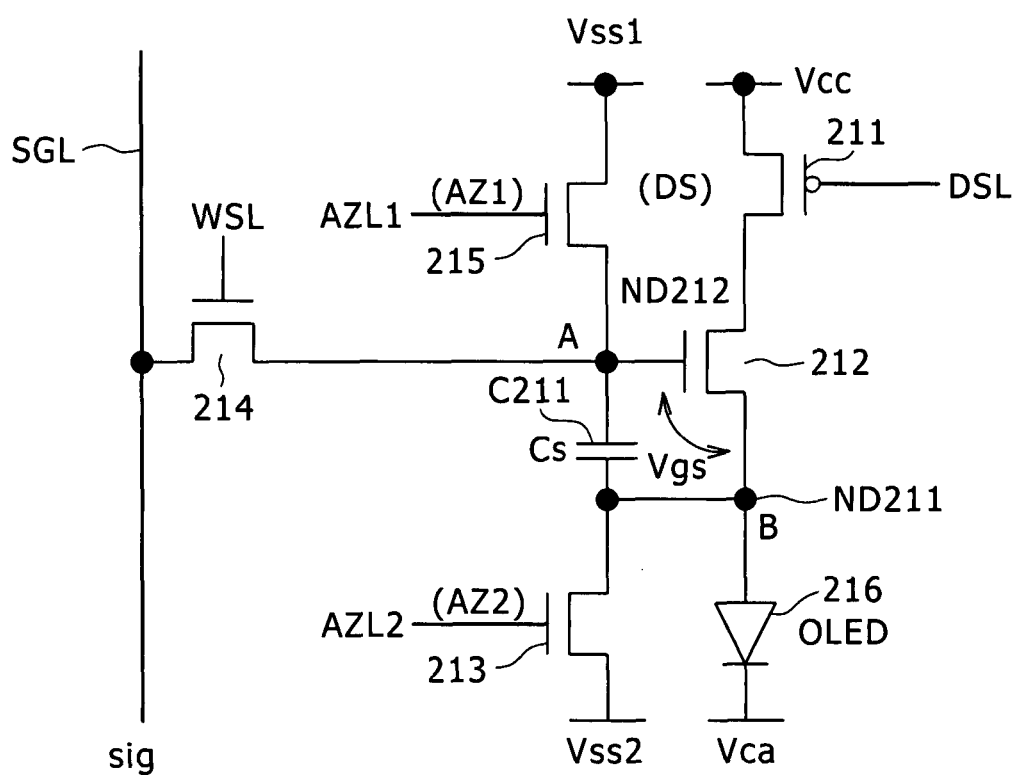
FIG. 31 is a circuit diagram showing a particular configuration of a pixel circuit shown in FIG. 30.

FIG. 31 shows a particular configuration of the pixel circuit according to the present embodiment.

Referring to FIGS. 30 and 31, the display apparatus 200 shown includes a pixel array section 202 in which pixel circuits 201 are arrayed in a m×n matrix, a horizontal selector 203 (HSEL), a writing scanner 204 (WSCN), a driving scanner 205 (DSCN), a first auto zero circuit 206 (AZRD1), and a second auto zero circuit 207 (AZRD2). The display apparatus 200 further includes signal lines SGL selected by the horizontal selector 203 and supplied with a data signal corresponding to luminance information, scanning lines WSL as second driving wiring lines selectively driven by the writing scanner 204, and driving lines DSL serving as first driving wiring lines selectively driven by the driving scanner 205. The display apparatus 200 further includes first auto zero lines AZL1 serving as fourth driving wiring lines selectively driven by the first auto zero circuit 206, and second auto zero lines AZL2 serving as third driving wiring lines selectively driven by the second auto zero circuit 207.

The pixel circuit 201 according to the present embodiment includes, as seen in FIGS. 30 and 31, a p-channel TFT 211, n-channel TFTs 212 to 215, a capacitor C211, a light emitting element 216 formed from an organic EL light emitting element (OLED: electro-optical element), a first node ND211, and a second node ND212.

A first switching transistor is formed from the p-channel TFT 211; a second switching transistor is formed from the TFT 213; a third switching transistor is formed from the TFT 215; and a fourth switching transistor is formed the TFT 214.

It is to be noted that a supply line (power supply potential) for the power supply voltage Vcc corresponds to a first reference potential, and the ground potential GND corresponds to a second reference potential. Further, the voltage Vss1 corresponds to a fourth reference voltage, and the voltage Vss2 corresponds to a third reference voltage.

In the pixel circuit 201, the p-channel TFT 211, the TFT 212 serving as a driving transistor, the first node ND211 and the light-emitting element (OLED) 216 are connected in series between the first reference potential (in the present embodiment, the power supply voltage Vcc) and the second reference potential (in the present embodiment, the ground potential GND). In particular, the light-emitting element 216 is connected at the cathode thereof to the ground potential GND and at the anode thereof to the p-channel TFT 211. The TFT 212 is connected at the source thereof to the first node ND211 and at the drain thereof to the drain of the p-channel TFT 211. The p-channel TFT 211 is connected at the source thereof to the power supply voltage Vcc.

The TFT 212 is connected at the gate thereof to the second node ND212, and the p-channel TFT 211 is connected at the gate thereof to the driving line DSL.

The TFT 213 is connected at the drain thereof to the first node ND211 and a first electrode of the capacitor C211, at the source thereof to the fixed potential Vss2, and at the gate thereof to the second auto zero line AZL2. Further, the capacitor C211 is connected at a second electrode thereof to the second node ND212.

The source and the drain of the TFT 214 are connected between the signal line SGL and the second node ND212, respectively. The TFT 214 is connected at the gate thereof to the scanning line WSL.

Further, the source and the drain of the TFT 215 are connected between the second node ND212 and the voltage Vss1, respectively. The TFT 215 is connected at the gate thereof to the first auto zero line AZL1.

In this manner, the pixel circuit 201 according to the present embodiment is configured such that the capacitor C211 serving as a pixel capacitor is connected between the gate and the source of the TFT 212 serving as a driving transistor and the source potential of the TFT 212 is connected to a fixed potential within the non-light emission period through the TFT 213 serving as a switching transistor while the gate and the drain of the TFT 212 are connected to each other so that a correction of the threshold voltage Vth is performed.

Then, in the present second embodiment, the first to third countermeasures for picture quality improvement described hereinabove in connection with the first embodiment are taken for at least one of the scanning line WSL and the driving line DSL, or two or more or all of the scanning line WSL, the driving line DSL and the auto zero lines AZL1 and AZL2.

By applying a desired one or ones of the countermeasures, a countermeasure against shading, striped irregularities and so forth arising from a delay of a driving signal (pulse) in wiring line resistance or wiring line capacitance over the overall panel is taken. Consequently, it is possible to obtain an image of good picture quality with the occurrence of shading, irregularities and so forth suppressed.

Now, an operation of the configuration described above, particularly an operation of a pixel circuit, is described with reference to FIGS. 32A to 32F.

It is to be noted that FIG. 32A illustrates a driving signal DS applied to the driving line DSL; FIG. 32B illustrates a driving signal WS (corresponding to the gate pulse GP in the first embodiment) applied to the scanning line WSL; FIG. 32C illustrates a driving signal AZ1 applied to the first auto zero line AZL1; FIG. 32D illustrates a driving signal AZ2 applied to the second auto zero line AZL2; FIG. 32E illustrates the potential at the second node ND112; and FIG. 32F illustrates the potential at the first node ND111.

The driving signal DS of the driving line DSL by the driving scanner 205 is kept at the high level, and the driving signal WS to the scanning line WSL by the writing scanner 204 is kept at the low level. Further, the driving signal AZ1 to the first auto zero line AZL1 by the first auto zero circuit 206 is kept at the low level, and the driving signal AZ2 to the second auto zero line AZL2 by the second auto zero circuit 207 is kept at the high level.

As a result, the TFT 213 is turned on, and thereupon, current flows through the TFT 213 and the source potential Vs of the TFT 212 (potential of the node ND 211) drops to the voltage Vss2. Therefore, also, the voltage applied to the EL light-emitting element 216 drops to 0 V, and the EL light-emitting element 216 is placed into a non-light emission state.

In this instance, even if the TFT 214 is turned on, the voltage held in the capacitor C211, that is, the gate potential of the second node ND212, does not vary.

Then, within the non-light emission period of the EL light-emitting element 216, the driving signal AZ1 to the first auto zero line AZL1 is set to the high level while the driving signal AZ2 to the second auto zero line AZL2 is kept to the high level, as seen in FIGS. 32C and 32D. Consequently, the potential at the second node ND212 changes to the voltage Vss1.

Then, after the driving signal AZ2 to the second auto zero line AZL2 is changed over to the low level, the driving signal DS of the driving line DSL by the driving scanner 205 is changed over to the low level for a predetermined period of time.

Consequently, the TFT 213 is turned off and the TFTs 215 and 212 are turned on. As a result, current flows along the route of the TFTs 212 and 211 and the potential at the first node rises.

Then, the driving signal DS of the driving line DSL by the driving scanner 205 is changed over to the high level and the driving signal AZ1 is changed over to the low level.

As a result, a correction of the threshold voltage Vth of the driving transistor TFT 212 is performed, and the potential difference between the second node ND212 and the first node ND211 becomes equal to the threshold voltage Vth.

In this state, after a lapse of a predetermined period of time, the driving signal WS to the scanning line WSL by the writing scanner 204 is kept at the high level for a predetermined period of time, the data is written into the node ND212 from the data line, the driving signal DS to the driving line DSL by the driving scanner 205 is changed over to the high level while the driving signal WS is kept to the high level, and soon, the driving signal WS is changed over to the low level.

At this time, the TFT 212 is turned on and the TFT 214 is turned off, and a correction of the mobility is performed.

In this instance, since the TFT 214 is in an off state and the gate-source voltage of the TFT 212 is fixed, the TFT 212 supplies fixed current Ids to the EL light emitting element 216. Consequently, the potential at the first node ND211 rises to the source potential Vx at which the current Ids flows to the EL light emitting element 216. Consequently, the EL light emitting element 216 emits light.

Here, also in the present circuit, if the light emitting time period becomes long, then the current-voltage (I-V) characteristic varies. Therefore, also, the potential at the first node ND211 varies. However, since the gate-source voltage Vgs of the TFT 212 is kept at a fixed value, the current flowing through the EL light-emitting element 216 does not vary. Therefore, even if the I-V characteristic of the EL light-emitting element 216 varies, the current Ids continues to flow and the luminance of the EL light emitting element 216 does not vary.

In the pixel circuit driven in this manner, since a countermeasure against shading, striped irregularities and so forth arising from a delay of a driving signal (pulse) by wiring line resistance over the overall panel is taken, it is possible to obtain an image of good picture quality with the occurrence of shading, irregularities and so forth suppressed.

While preferred embodiments of the present invention have been described using specific terms, such description is for illustrative purposes only, and it is to be understood that changes and variations may be made without departing from the spirit or scope of the following claims.

The invention claimed is:

1. A display apparatus, comprising:
a plurality of pixel circuits arrayed in a matrix;
a plurality of driving wiring lines to which said pixel circuits are connected; and
a plurality of signal lines wired so as to cross with said plurality of driving wiring lines and having said pixel circuits connected;
said plurality of signal lines being wired in parallel to each other,
wherein said plurality of signal lines include a main signal line and a sub signal line wired vertically in parallel to each other and both the main signal line and the sub signal line are disposed on one side of a column of each of said plurality of pixel circuits, and
the main signal line and the sub signal line are connected to each other by connecting wiring lines horizontally in parallel to each other, including at a first predetermined position where the sub signal line and one of the connecting wiring lines meet and a second predetermined position where the sub signal line and another one of the connecting wiring lines meet,
wherein, where one of said pixel circuits which is to be connected is defective, the main signal line is cut at a predetermined portion between a first position and the defect position and at another predetermined portion between a second position and the defect position, whereby the main signal line between the first and second positions is replaced with the sub signal line.

2. The display apparatus according to claim 1, wherein the main signal line and the sub signal line are connected to each other at the first position by a connection wiring line and also at the second position by another connection wiring line while the sub signal line is cut on the outside of a processing region with respect to the first position and also on the outside of the processing region with respect to the second position.

3. A fabrication method for a display apparatus which includes a plurality of pixel circuits arrayed in a matrix, a plurality of driving wiring lines to which said pixel circuits are connected, and a plurality of signal lines wired so as to cross with said plurality of driving wiring lines and having said pixel circuits connected, said signal lines being wired in parallel to each other, comprising the steps of:
wiring said signal lines which include a main signal line and a sub signal line which extend in parallel to each other and both said main signal line and said sub signal line are disposed on one side of a column of said plurality of pixel circuits;

connecting the main signal line and the sub signal line to each other at two predetermined first and second positions across each of said pixel circuits in a wiring direction of said signal lines individually by connection wiring lines;

cutting, where one of said pixel circuits which is to be connected is defective, the main signal line at a predetermined portion between the first position and the defect position; and cutting the main signal line at another predetermined portion between the second position and the defect position, whereby the main signal line between the first and second positions is replaced with the sub signal line.

4. A fabrication method for a display apparatus which includes a plurality of pixel circuits arrayed in a matrix, a plurality of driving wiring lines to which said pixel circuits are connected, and a plurality of signal lines wired so as to cross with said plurality of driving wiring lines and having said pixel circuits connected, said signal lines being wired in parallel to each other, comprising the steps of:

wiring said signal lines which include a main signal line and a sub signal line which extend in parallel to each other and both said main signal line and said sub signal line are disposed on one side of a column of said plurality of pixel circuits;

cutting, where one of said pixel circuits which is to be connected is defective, the main signal line at a predetermined portion between, from between two predetermined first and second positions across the defective pixel circuit in a wiring direction of said signal lines, the first position and the defect position;

cutting the main signal line at another predetermined portion between the second position and the defect position;

connecting the main signal line and the sub signal line to each other at the first position by a connection wiring line;

connecting the main signal line and the sub signal line to each other at the second position by another connection wiring line;

cutting the sub signal line on the outside of a processing region with respect to the first position; and cutting the sub signal line on the outside of the processing region with respect to the second position, whereby the main signal line between the first and second positions is replaced with the sub signal line.

5. A fabrication method for a display apparatus which includes a plurality of pixel circuits arrayed in a matrix, a plurality of driving wiring lines to which said pixel circuits are connected, and a plurality of signal lines wired so as to cross with said plurality of driving wiring lines and having said pixel circuits connected, said signal lines being wired in parallel to each other, comprising the steps of:

wiring said signal lines which include a main signal line and a sub signal line which extend in parallel to each other, the sub signal line being wired for each of said pixel circuits;

cutting, where one of said pixel circuits which is to be connected is defective, the main signal line at a predetermined portion between, from between two predetermined first and second positions across the defective pixel circuit in a wiring direction of said signal lines, the first position and the defect position;

cutting the main signal line at another predetermined portion between the second position and the defect position;

connecting the main signal line and the sub signal line to each other at the first position by a connection wiring line; and connecting the main signal line and the sub signal line to each other at the second position by another connection wiring line, whereby the main signal line between the first and second positions is replaced with the sub signal line.

* * * * *